(12) United States Patent
Li et al.

(10) Patent No.: US 9,076,771 B2
(45) Date of Patent: Jul. 7, 2015

(54) VARACTOR THAT APPLIES BIAS VOLTAGE TO TWO THROUGH WAFER VIAS TO DETERMINE CAPACITANCE OF DEPLETION REGION CAPACITOR FORMED BETWEEN THE TWO THROUGH WAFER VIAS

(71) Applicant: INDUSTRIAL TECHNOLOGY RESEARCH INSTITUTE, Hsinchu (TW)

(72) Inventors: Sih-Han Li, New Taipei (TW); Pei-Ling Tseng, Miaoli County (TW); Zhe-Hui Lin, Changhua County (TW); Chih-Sheng Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 37 days.

(21) Appl. No.: 13/974,909

(22) Filed: Aug. 23, 2013

(65) Prior Publication Data

US 2014/0175606 A1   Jun. 26, 2014

(30) Foreign Application Priority Data

Dec. 26, 2012   (TW) .............................. 101150042 A

(51) Int. Cl.
*H01L 29/93*   (2006.01)
*H01L 23/48*   (2006.01)
*H01L 27/08*   (2006.01)
*H01L 29/94*   (2006.01)

(52) U.S. Cl.
CPC ........... *H01L 23/481* (2013.01); *H01L 27/0808* (2013.01); *H01L 29/93* (2013.01); *H01L 29/94* (2013.01); *H01L 2924/0002* (2013.01)

(58) Field of Classification Search
USPC .......................................... 257/595
See application file for complete search history.

(56) References Cited

U.S. PATENT DOCUMENTS

| | | |
|---|---|---|
| 2009/0311841 A1 | 12/2009 | Bavisi et al. |
| 2010/0224876 A1 | 9/2010 | Zhu |
| 2010/0308435 A1 | 12/2010 | Nowak et al. |
| 2011/0027962 A1 | 2/2011 | Bernstein et al. |
| 2011/0068468 A1 | 3/2011 | Lin et al. |
| 2011/0068880 A1 | 3/2011 | Ho |
| 2011/0084358 A1 | 4/2011 | Kim et al. |
| 2011/0091685 A1 | 4/2011 | Farooq et al. |
| 2011/0101537 A1 | 5/2011 | Barth et al. |
| 2011/0104426 A1 | 5/2011 | Farooq et al. |
| 2011/0108948 A1 | 5/2011 | Kim et al. |

(Continued)

OTHER PUBLICATIONS

Chuan Xu et al., "Compact AC Modeling and Performance Analysis of Through-Silicon Vias in 3-D ICS," IEEE Transactions on Electron Devices, Dec. 2010, pp. 3405-3417, vol. 57, No. 22, IEEE, US.

(Continued)

*Primary Examiner* — Stephen W Smoot

(57) ABSTRACT

A varactor is provided. A substrate includes a first surface, a second surface and a first opening and a second opening in the substrate. A conductive material is filling the first and second openings, to form a first through-wafer via (TWV) and a second through-wafer via. A first capacitor is coupled between the first through-wafer via and a first terminal. A second capacitor is coupled between the second through-wafer via and a second terminal. A capacitance of a depletion-region capacitor between the first through-wafer via and the second through-wafer via is determined by a bias voltage applied to the first through-wafer via and the second through-wafer via.

37 Claims, 19 Drawing Sheets

(56) References Cited

U.S. PATENT DOCUMENTS

| | | |
|---|---|---|
| 2011/0168434 A1 | 7/2011 | Farooq et al. |
| 2011/0193197 A1 | 8/2011 | Farooq et al. |
| 2011/0193240 A1 | 8/2011 | Farooq et al. |
| 2011/0233785 A1 | 9/2011 | Koester et al. |
| 2011/0241185 A1 | 10/2011 | Koester et al. |
| 2011/0248396 A1 | 10/2011 | Liu et al. |
| 2011/0298551 A1 | 12/2011 | Yen et al. |
| 2014/0184346 A1* | 7/2014 | Li et al. .................. 331/115 |

OTHER PUBLICATIONS

Tapobrata Bandyopadhyay et al., "Rigorous Electrical Modeling of Through Silicon Vias (TSVs) with MOS Capacitance Effects", IEEE Transactions of Components, Packaging and Manufacturing Technology, Jun. 2011, pp. 893-903, vol. 1, No. 6, IEEE, US.

Jonghyun Cho et al., "Through-Silicon Via (TSV) Depletion Effect," Oct. 2011, Electrical Performance of Electronic Packaging and Systems (EPEPS), pp. 101-104, IEEE, US.

Tapobrata Bandyopadhyay et al., "Electrical Modeling of Through Silicon and Package Vias," 3D System Integration, 2009. 3DIC 2009, Sep. 2009, pp. 1-8, IEEE, US.

Guruprasad Katti et al., "Electrical Modeling and Characterization of Through Silicon via for Three-Dimensional ICs," IEEE Transactions on Electron Devices, Jan. 2010, pp. 256-262, vol. 57, No. 1, IEEE, US.

* cited by examiner

VARACTOR THAT APPLIES BIAS VOLTAGE TO TWO THROUGH WAFER VIAS TO DETERMINE CAPACITANCE OF DEPLETION REGION CAPACITOR FORMED BETWEEN THE TWO THROUGH WAFER VIAS

CROSS REFERENCE TO RELATED APPLICATIONS

This application claims priority of Taiwan Patent Application No. 101150042, filed on Dec. 26, 2012, the entirety of which is incorporated by reference herein.

BACKGROUND OF THE DISCLOSURE

1. Technical Field Disclosure

The disclosure relates to a varactor, and more particularly, to a varactor with a through-wafer via (TWV) structure.

2. Description of the Related Art

Three-dimensional (3D) integrated circuits and stacked chips or wafers are used to solve some development limitations of two-dimensional integrated circuits. Typically, a three-dimensional integrated circuit is formed by using through-wafer vias (TWVs) in a semiconductor substrate, to provide the stacked chip/wafer packaging structures, such as using the through-wafer vias to connect the chips or wafers. Therefore, the lengths of the metal wires and the impedances of the wires/traces are decreased and the chip area is also reduced, thereby having the advantages: small size, high integration, high efficiency, low power consumption and low cost.

Before making a three-dimensional stack, different chips or wafers are separately completed by the suitable front-end processes (such as the processes for forming active devices, connecting the metal lines and so on), and then the through-wafer vias and the re-distributed layers (RDLs) are used to complete the stack steps of the back-end processes, wherein the process step is also known as a via last process. Nowadays, the back-end processes are further used to form various integrated passive devices (IPDs), so as to efficiently use the back-end process areas. Furthermore, the passive devices of the front-end processes can be implemented by the back-end processes, and the passive devices can be connected by the through-wafer vias, so as to decrease the expensive front-end process areas, thereby reducing manufacturing costs. At present, the varactors are often used in high-speed circuits. However, the production of the varactor requires a plurality of masks and process steps.

Therefore, a varactor with a through-wafer via structure is desired.

BRIEF SUMMARY OF THE DISCLOSURE

Varactors are provided. An embodiment of a varactor is provided. The varactor comprises: a substrate, comprising a first surface, a second surface substantially parallel to the first surface, and a first opening and a second opening in the substrate; a conductive material, filling the first opening and the second opening to respectively form a first through-wafer via and a second through-wafer via; a first capacitor coupled between the first through-wafer via and a first terminal; and a second capacitor coupled between the second through-wafer via and a second terminal. A capacitance of a depletion-region capacitor between the first through-wafer via and the second through-wafer via is determined by a bias voltage applied to the first through-wafer via and the second through-wafer via.

Furthermore, another embodiment of a varactor is provided. The varactor comprises a first wafer and a second wafer disposed below the first wafer. The wafer comprises: a first substrate, comprising a first surface, a second surface substantially parallel to the first surface, and a first opening and a second opening in the first substrate; a first conductive material, filling the first opening and the second opening to form a first through-wafer via and a second through-wafer via, respectively; a first conductive layer disposed on the second surface of the first substrate, comprising a first trace coupled to the second through-wafer via; and a first capacitor coupled between the first through-wafer via and a first terminal. The second wafer disposed below the first wafer comprises: a second substrate, comprising a third surface and a fourth surface substantially parallel to the first surface; and a second conductive layer disposed on the third surface of the second substrate, comprising a second trace coupled to a second terminal. A second capacitor is formed by the first trace of the first conductive layer and the second trace of the second conductive layer. A capacitance of a first depletion-region capacitor between the first through-wafer via and the second through-wafer via is determined by a bias voltage applied to the first through-wafer via and the second through-wafer via.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
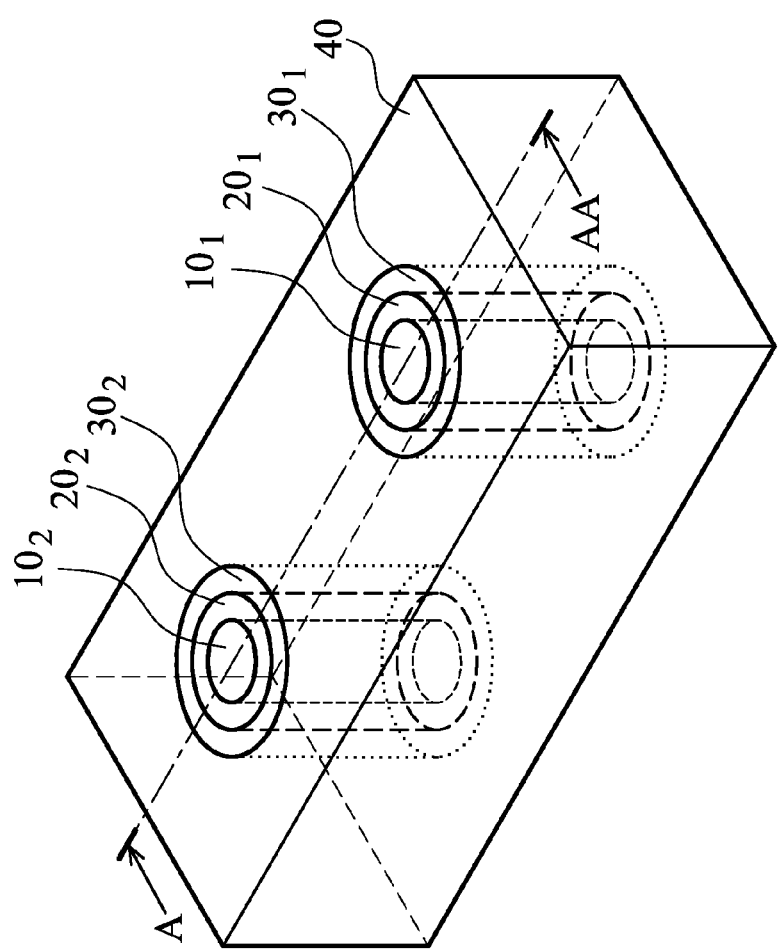
FIG. 1 shows a perspective diagram illustrating a dual through-wafer via (TWV) structure according to an embodiment of the disclosure.

FIG. 1 shows a perspective diagram illustrating a dual through-wafer via (TWV) structure according to an embodiment of the disclosure. In FIG. 1, the TWV $10_1$ and the TWV $10_2$ are disposed in a semiconductor substrate 40. A dielectric layer $20_1$ is disposed around the TWV $10_1$ to surround the TWV $10_1$, and a dielectric layer $20_2$ is disposed around the TWV $10_2$ to surround the TWV $10_2$, wherein the dielectric layer $20_1$ and the dielectric layer $20_2$ may be the insulator layers formed by SiO2. Furthermore, when a voltage is respectively applied to the TWV $10_1$ and TWV $10_2$, the circumferences of the dielectric layer $20_1$ and the dielectric layer $20_2$ form a depletion region $30_1$ and a depletion region $30_2$. In the embodiment, the TWV $10_1$ and the TWV $10_2$ are cylinders.

Figure 2:
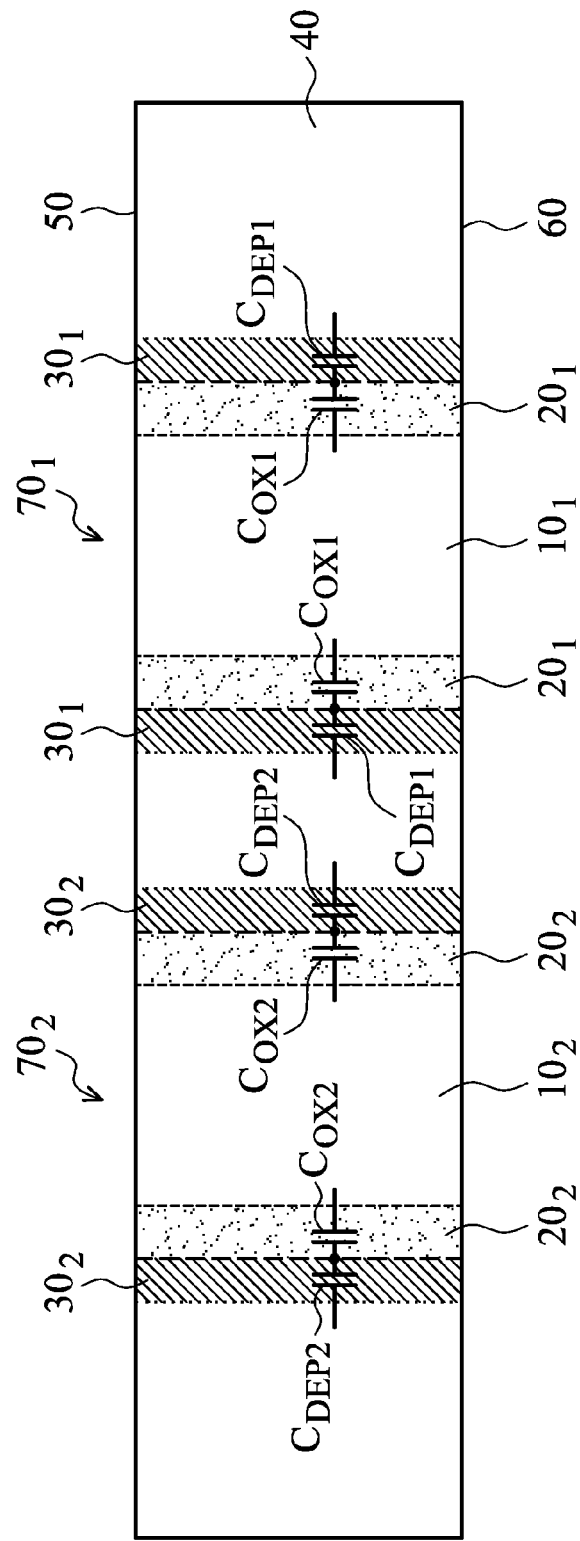
FIG. 2 shows a sectional diagram along a section line A-AA of the dual TWV structure of FIG. 1.

FIG. 2 shows a sectional diagram along a section line A-AA of the dual TWV structure of FIG. 1. In FIG. 2, a semiconductor substrate 40 comprises a first surface 50 (e.g. an upper surface) and a second surface 60 (e.g. a lower surface), wherein the first surface 50 and the second surface 60 are substantially parallel to each other. Moreover, the semiconductor substrate 40 further comprises a first opening $70_1$ and a second opening $70_2$ throughout the semiconductor substrate 40, i.e. the first opening $70_1$ and the second opening $70_2$ are both extended to the second surface 60 from the first surface 50. In the semiconductor substrate 40, the dielectric layer $20_1$ is disposed on a side surface (an inner surface) of the first opening $70_1$, and the dielectric layer $20_2$ is disposed on a side surface (an inner surface) of the second opening $70_2$. In addition, a conductive material is formed in the dielectric layer $20_1$ and the dielectric layer $20_2$, and the conductive material is filling the first opening $70_1$ and the second opening $70_2$, to form the TWV $10_1$ and the TWV $10_2$, respectively. The dielectric layer $20_1$ has a parasitic capacitor $C_{OX1}$, and the dielectric layer $20_2$ has a parasitic capacitor $C_{OX2}$. Furthermore, when a voltage is respectively applied to the TWV $10_1$ and the TWV $10_2$, the capacitances of a parasitic capacitor $C_{DEP1}$ of the depletion region $30_1$ and a parasitic capacitor $C_{DEP2}$ of the depletion region $30_2$ are changed according to a variation of the applied voltage. Specifically, the capacitance of the parasitic capacitor $C_{DEP1}$ is determined according to the voltage difference between the semiconductor substrate 40 and the TWV $10_1$, and the capacitance of the parasitic capacitor $C_{DEP2}$ is determined according to the voltage difference between the semiconductor substrate 40 and the TWV $10_2$. In the embodiment, the semiconductor substrate 40 is coupled to a fixed bias voltage source, wherein a voltage of the fixed bias voltage source is determined according to actual applications, and the semiconductor substrate 40 is grounded in the embodiment.

Figure 3:
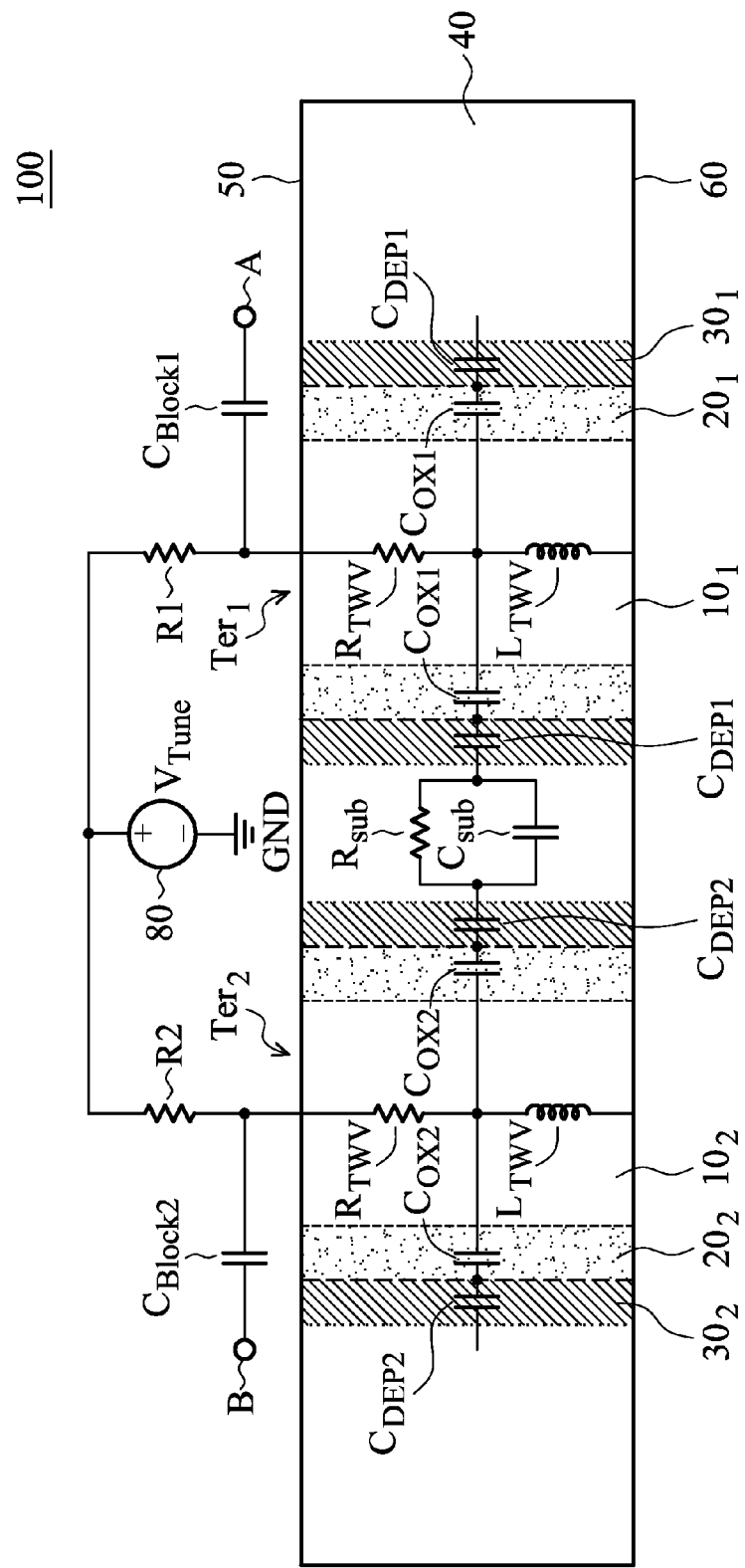
FIG. 3 shows an equivalent parasitic model of a varactor according to an embodiment of the disclosure.

FIG. 3 shows an equivalent parasitic model of a varactor 100 according to an embodiment of the disclosure. In FIG. 3, a resistor $T_{TWV}$ represents a resistive loss of a TWV, and an inductor $L_{TWV}$ represents an inductive loss of the TWV. Furthermore, a resistor $R_{Sub}$ and a capacitor $C_{Sub}$ represent a substrate loss. Moreover, a bias voltage source 80 provides a bias voltage $V_{Tune}$ to the TWV $10_1$ and the TWV $10_2$ via the resistors R1 and R2, respectively, wherein the resistors R1 and R2 are used to pass a direct current (DC) bias voltage and to block an alternating current (AC) signal. In an embodiment, the resistor R1 represents an equivalent parasitic resistor of a trace between a terminal $Ter_1$ aligned the first surface 50 and the bias voltage source 80, and the resistor R2 represents an equivalent parasitic resistor of a trace between a terminal $Ter_2$ aligned the first surface 50 and the bias voltage source 80. Furthermore, in another embodiment, other suitable devices (e.g. an inductor) can be used to replace the resistors R1 and R2, so as to pass the DC bias voltage and to block the AC signal. In addition, the bias voltage source 80 can be separated into two independent bias voltage sources, to provide different bias voltages to the terminal $Ter_1$ and the terminal $Ter_2$, respectively. In order to avoid the bias voltage $V_{Tune}$ being affected by the signals of terminals A and B applied to the TWV $10_1$ and the TWV $10_2$, respectively, the varactor 100 further comprises a capacitor $C_{Block1}$ and a capacitor $C_{Block2}$, so as to adjust the DC level of the signal to the DC level of the bias voltage $V_{Tune}$. In the varactor 100, the capacitor $C_{Block1}$ is coupled between the terminal $Ter_1$ of the TWV $10_1$ and the terminal A of the varactor 100, and the capacitor $C_{Block2}$ is coupled between the terminal $Ter_2$ of the TWV $10_2$ and the terminal B of the varactor 100.

Figure 4:
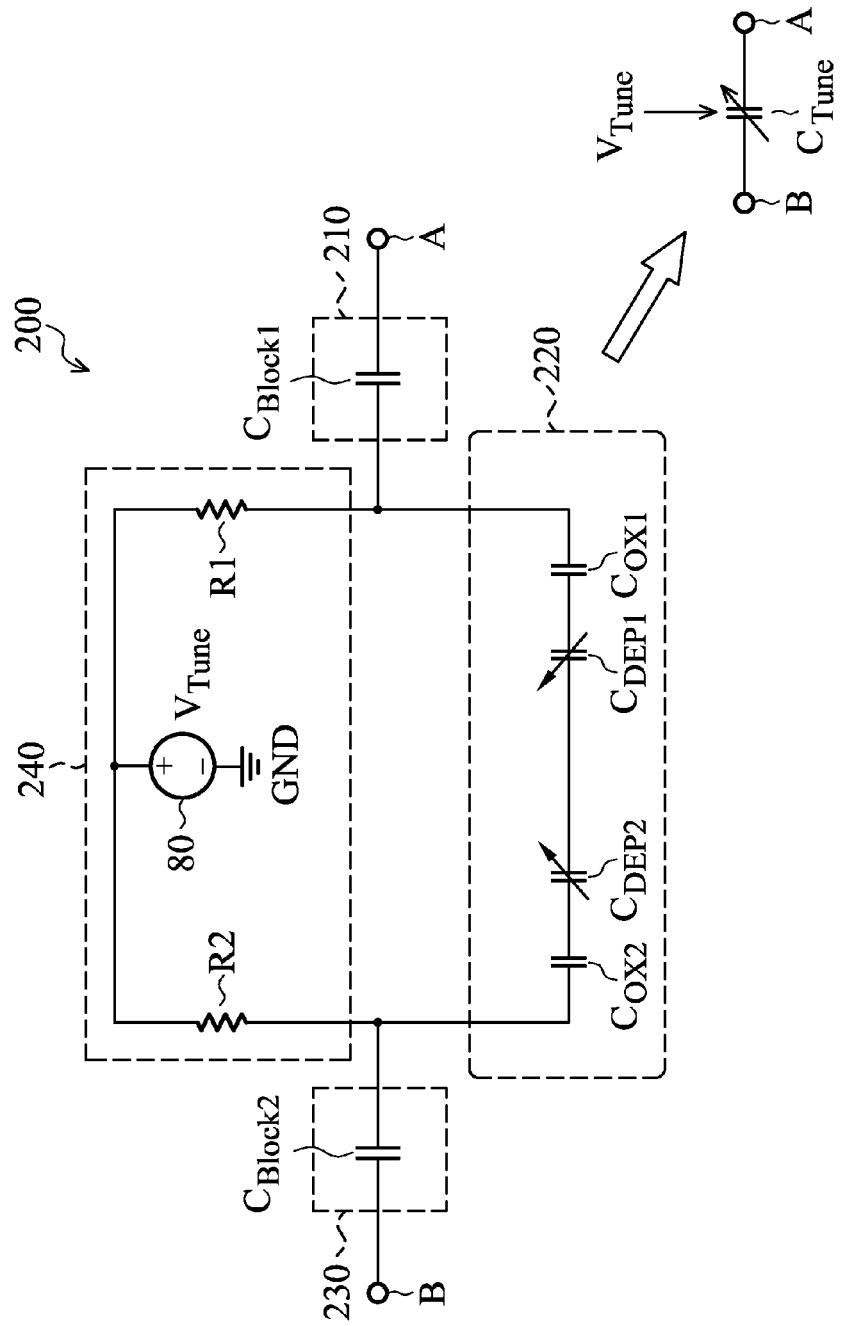
FIG. 4 shows an equivalent circuit diagram of a varactor according to an embodiment of the disclosure, wherein the varactor has a variable capacitance.

FIG. 4 shows an equivalent circuit diagram of a varactor 200 according to an embodiment of the disclosure, wherein the varactor 200 has a variable capacitance $C_{Tune}$. Referring to FIG. 3 and FIG. 4 together, compared with the parasitic capacitors $C_{OX1}$, $C_{OX2}$, $C_{DEP1}$ and $C_{DEP2}$, the resistors R1, R2, $R_{TWV}$ and $R_{Sub}$, the inductor $L_{TWV}$ and the capacitor $C_{Sub}$ have small parasitic effects, and no influence on the whole equivalent capacitance $C_{Tune}$. Thus, the small parasitic effects can be ignored in order to facilitate the estimation of the whole equivalent capacitance $C_{Tune}$. Therefore, only the coupling effects of the capacitors $C_{OX1}$, $C_{OX2}$, $C_{DEP1}$, $C_{DEP2}$, $C_{Block1}$ and $C_{Block2}$ need to be considered for the varactor 200. In FIG. 4, the varactor 200 comprises a DC blocking unit 210, a TWV unit 220, a DC blocking unit 230 and a DC bias unit 240. The DC blocking unit 210 is coupled between the terminal A of the varactor 200 and the TWV unit 220, and the DC blocking unit 210 is equivalent to the capacitor $C_{Block1}$. The TWV unit 220 is coupled between the DC blocking unit 210 and the DC blocking unit 230, and the TWV unit 220 comprises the capacitor $C_{OX1}$, the capacitor $C_{DEP1}$, the capacitor $C_{DEP2}$ and the capacitor $C_{OX2}$ connected in parallel. The DC blocking unit 230 is coupled between the terminal B of the varactor 200 and the TWV unit 220, and the DC blocking unit 230 is equivalent to the capacitor $C_{Block2}$. The DC bias unit 240 is used to provide the bias voltage $V_{Tune}$ to the TWV unit 220, so as to adjust the capacitances of the capacitor $C_{DEP1}$ and the capacitor $C_{DEP2}$. Therefore, the capacitance $C_{Tune}$ of the varactor 200 is determined by the capacitor $C_{OX1}$, the capacitor $C_{OX2}$, the capacitor $C_{DEP1}$, the capacitor $C_{DEP2}$, the capacitor $C_{Block1}$ and the capacitor $C_{Block2}$, wherein the capacitances of the capacitors $C_{DEP1}$ and $C_{DEP2}$ are controlled by the bias voltage $V_{Tune}$.

Figure 5:
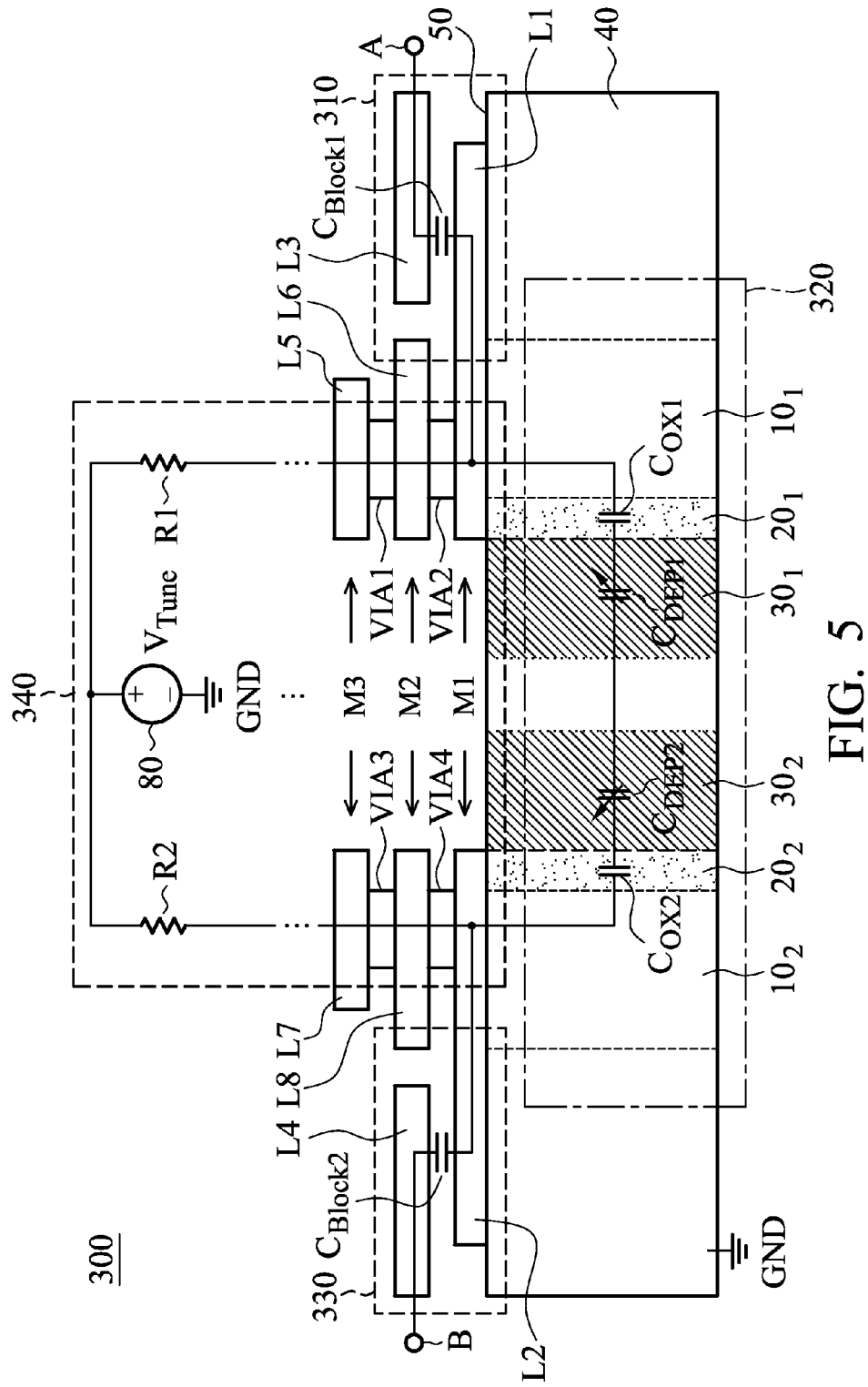
FIG. 5 shows a sectional diagram of a varactor according to an embodiment of the disclosure.

FIG. 5 shows a sectional diagram of a varactor 300 according to an embodiment of the disclosure. In FIG. 5, a conductive layer M1 is disposed on the first surface 50 of the semiconductor substrate 40. A conductive layer M2 is disposed on the conductive layer M1. A conductive layer M3 is disposed on the conductive layer M2. In the embodiment, the conductive layers M1, M2 and M3 may be the metal layers or the poly-silicon layers. Furthermore, a dielectric layer is disposed between two adjacent conductive layers, and the two adjacent conductive layers are connected to each other through the vias. As described above, the varactor 300 comprises a DC blocking unit 310, a TWV unit 320, a DC blocking unit 330 and a DC bias unit 340. The TWV unit 320 is formed by a dual TWV structure disposed in the semiconductor substrate 40. The DC blocking unit 310 is formed by a trace L1 of the conductive layer M1 and a trace L3 of the conductive layer M2, wherein the trace L1 of the conductive layer M1 is further coupled to the TWV $10_1$. Moreover, the capacitor $C_{Block1}$ of the DC blocking unit 310 is a coupling capacitor between the traces L1 and L3, which is used to block the DC component of a signal at the terminal A for the varactor 300, e.g. an input or output signal for the varactor 300. The DC blocking unit 330 is formed by a trace L2 of the conductive layer M1 and a trace L4 of the conductive layer M2, wherein the trace L2 of the conductive layer M1 is further coupled to the TWV $10_2$. Furthermore, the capacitor $C_{Block2}$ of the DC blocking unit 330 is a coupling capacitor between the traces L2 and trace L4, which is used to block the DC component of a signal at the terminal B for the varactor 300, e.g. an input or output signal for the varactor 300. The capacitances of the capacitor $C_{Block1}$ and the capacitor $C_{Block2}$ can be increased by using a plurality of parallel plates or a finger arrangement layout. In the DC bias unit 340, the bias voltage source 80 is coupled to the trace L1 of the conductive layer M1 via the trace L5 of the conductive layer M3, the via VIA1, the trace L6 of the conductive layer M2 and the via VIA2, so as to provide the bias voltage $V_{Tune}$ to the TWV $10_1$. Simultaneously, the bias voltage source 80 is coupled to the trace L2 of the conductive layer M1 via the trace L7 of the conductive layer M3, the via VIA3, the trace L8 of the conductive layer M2 and the via VIA4, so as to provide the bias voltage $V_{Tune}$ to the TWV $10_2$. Thus, the capacitances of the parasitic capacitor $C_{DEP1}$ of the depletion region $30_1$ and the parasitic capacitor $C_{DEP2}$ of the depletion region $30_2$ can be controlled by adjusting the bias voltage $V_{Tune}$, so as to adjust the capacitance $C_{Tune}$ of the varactor 300. It should be noted that the two TWVs of FIG. 5 are used as an example to illustrate, and not to limit the disclosure. In other embodiments, more TWVs can be implemented in the semiconductor substrate 40, the connections (e.g. in series, parallel, or combinations thereof) of the parasitic capacitors of the depletion regions can be controlled by various traces of the conductive layers, so as to change the capacitance $C_{Tune}$ of the varactor.

Figure 6:
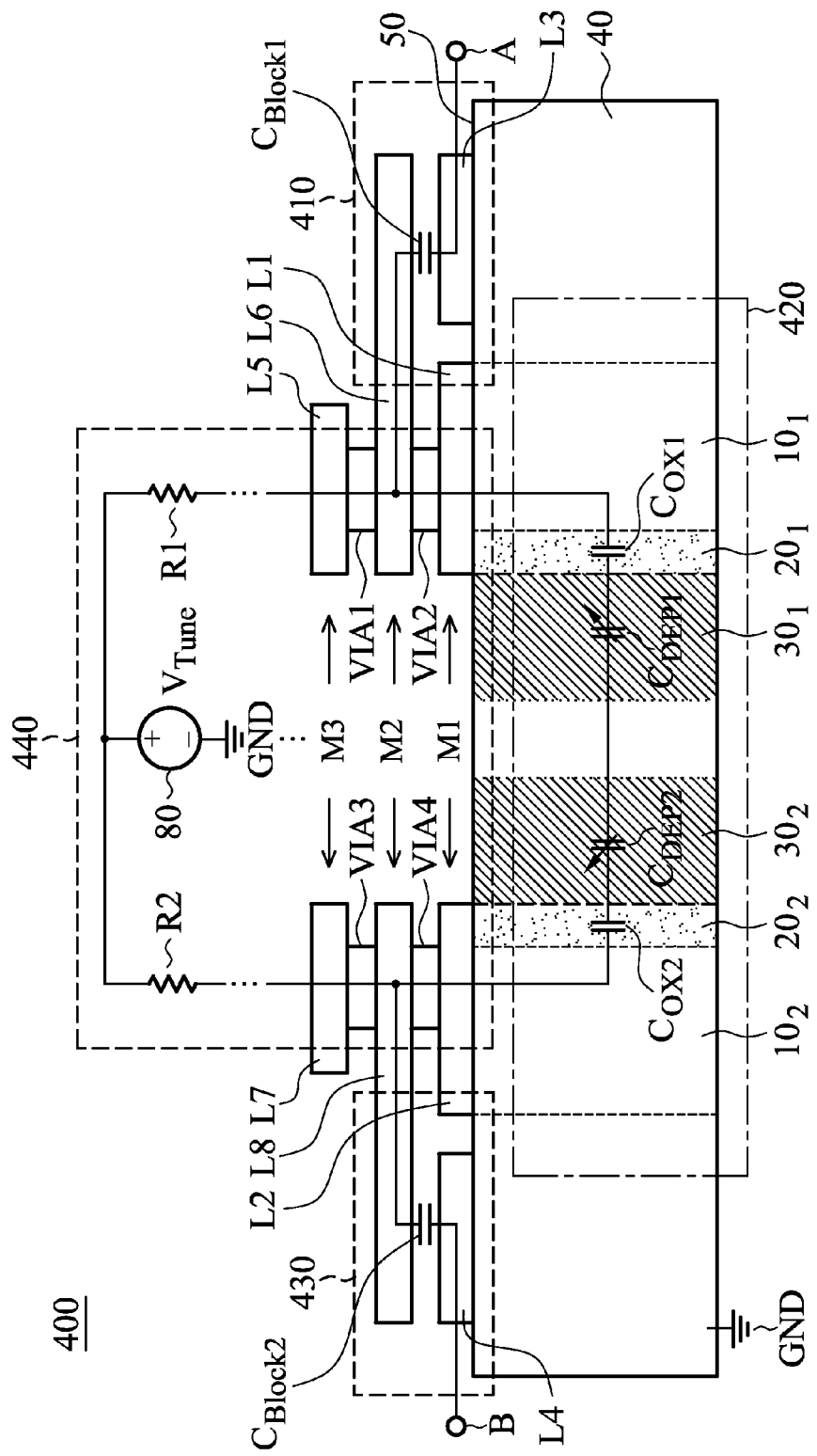
FIG. 6 shows a sectional diagram of a varactor according to another embodiment of the disclosure.

FIG. 6 shows a sectional diagram of a varactor 400 according to another embodiment of the disclosure. The varactor 400 comprises a DC blocking unit 410, a TWV unit 420, a DC blocking unit 430 and a DC bias unit 440. The TWV unit 420 is formed by a dual TWV structure disposed in the semiconductor substrate 40. The DC blocking unit 410 is formed by the trace L3 of the conductive layer M1 and the trace L6 of the conductive layer M2, wherein the trace L6 of the conductive layer M2 is further coupled to the TWV $10_1$ through the via VIA2 and the trace L1 of the conductive layer M1. Furthermore, the capacitor $C_{Block1}$ of the DC blocking unit 410 is a coupling capacitor between the traces L3 and L6, which is used to block the DC component of a signal at the terminal A for the varactor 400. The DC blocking unit 430 is formed by the trace L4 of the conductive layer M1 and the trace L8 of the conductive layer M2, wherein the trace L8 of the conductive layer M2 is further coupled to the TWV $10_2$ through the via VIA4 and the trace L2 of the conductive layer M1. In addition, the capacitor $C_{Block2}$ of the DC blocking unit 430 is a coupling capacitor between the traces L4 and L8, which is used to block the DC component of a signal at the terminal B for the varactor 400. Therefore, according to the actual layout status, the traces of any two conductive layers and the dielectric layer between the conductive layers can be used to form the capacitors $C_{Block1}$ and $C_{Block2}$.

Figure 7:
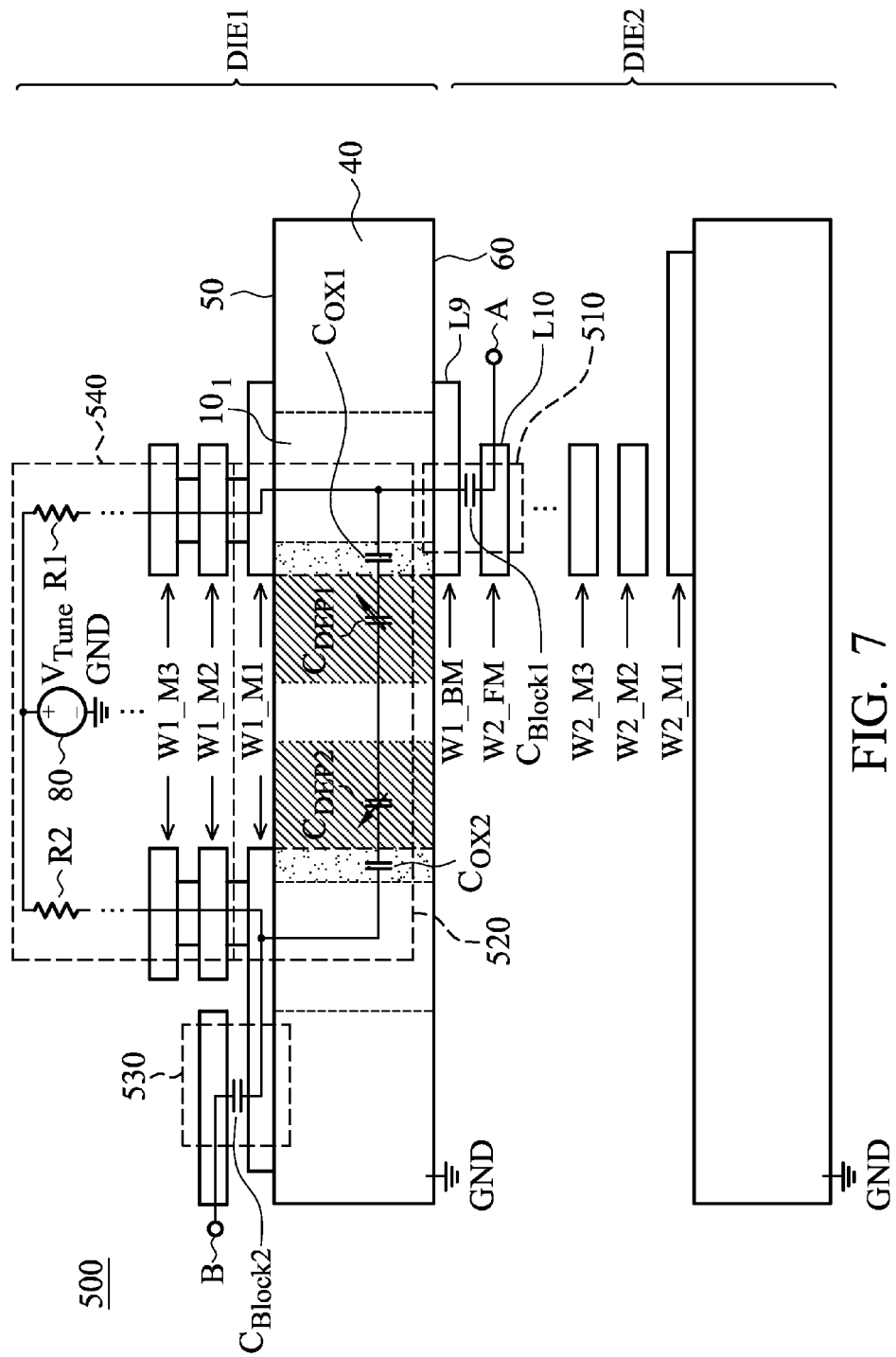
FIG. 7 shows a sectional diagram of a varactor according to another embodiment of the disclosure.

FIG. 7 shows a sectional diagram of a varactor 500 according to another embodiment of the disclosure. In the embodiment, a wafer DIE1 and a wafer DIE2 are stacked to form the varactor 500. As described above, the varactor 500 comprises a DC blocking unit 510, a TWV unit 520, a DC blocking unit 530 and a DC bias unit 540. However, compared to the DC blocking unit 310 of varactor 300 of FIG. 5, the DC blocking unit 510 of the varactor 500 is formed by the trace L9 of a conductive layer W1_BM and the trace L10 of a conductive layer W2_FM. The conductive layer W1_BM is disposed on the second surface 60 of the semiconductor substrate 40 of the wafer DIE1, and the conductive layer W2_FM is disposed on the conductive layer W1_BM, wherein the trace L9 of the conductive layer W1_BM is further coupled to the TWV $10_1$. Furthermore, the capacitor $C_{Block1}$ of the DC blocking unit 510 is a coupling capacitor between the trace L9 and the trace L10, which is used to block the DC component of a signal at the terminal A of the varactor 500. In one embodiment, the conductive layer W1_BM is a bottom metal of the upper wafer DIE1, and the conductive layer W2_FM is a front metal of the lower wafer DIE2.

Figure 8:
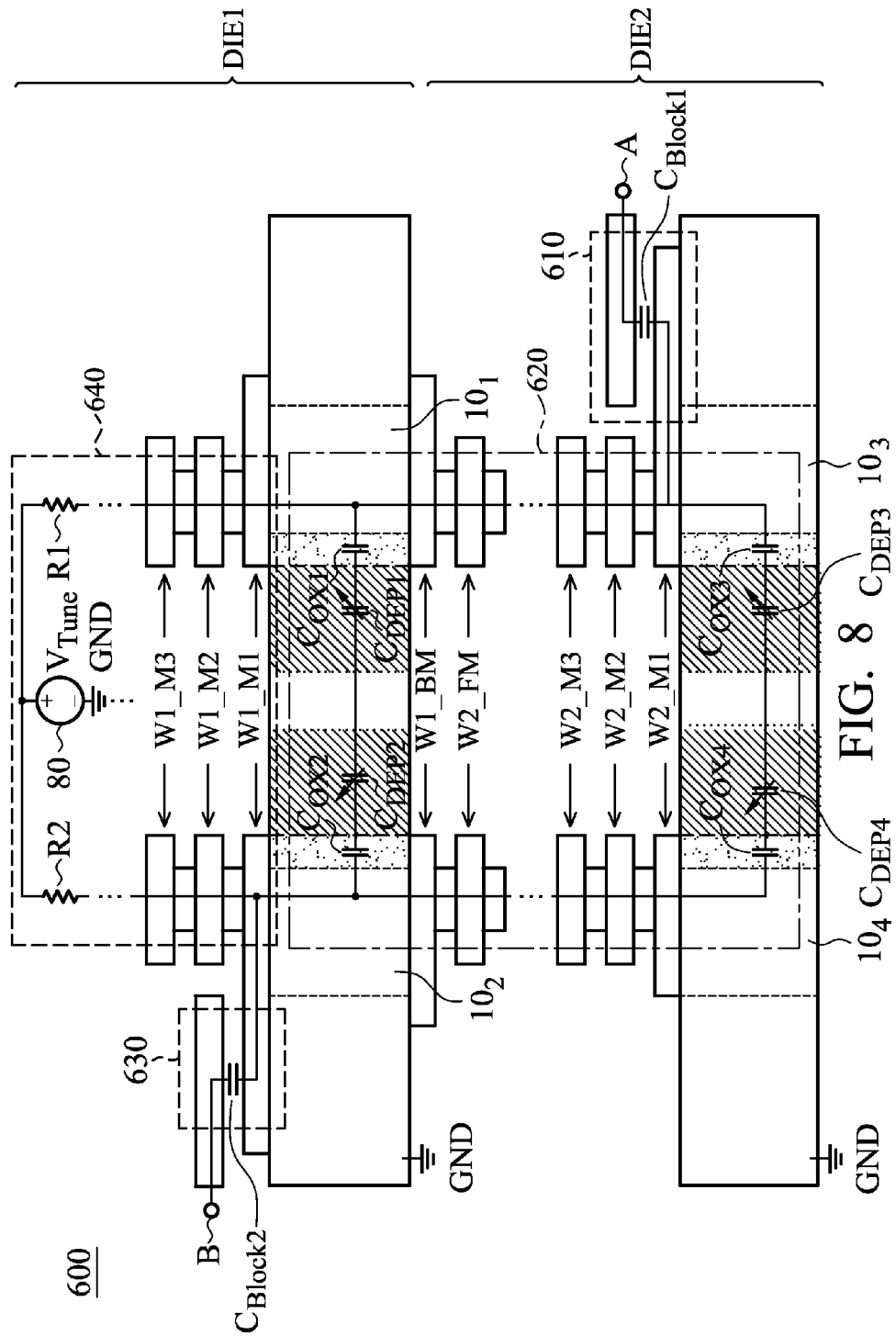
FIG. 8 shows a sectional diagram of a varactor according to another embodiment of the disclosure.

FIG. 8 shows a sectional diagram of a varactor 600 according to another embodiment of the disclosure. In the embodiment, a wafer DIE1 and a wafer DIE2 are stacked to form the varactor 600. The varactor 600 comprises a DC blocking unit 610, a TWV unit 620, a DC blocking unit 630 and a DC bias unit 640. In the embodiment, the TWV unit 620 is formed by paralleling the TWV structures of the two wafers DIE1 and DIE2. The TWV $10_1$ of the wafer DIE1 is coupled to the TWV $10_3$ of the wafer DIE2 through the traces of the conductive layers W1_BM, W2_FM, . . . , W2_M3, W2_M2 and W2_M1 sequentially and the vias between the conductive layers, and the TWV $10_2$ of the wafer DIE1 is coupled to the TWV $10_4$ of the wafer DIE2 through the traces of the conductive layers W1_BM, W2_FM, . . . , W2_M3, W2_M2 and W2_M1 sequentially and the vias between the conductive layers. Therefore, the capacitors $C_{OX1}$, $C_{DEP1}$, $C_{DEP2}$ and $C_{OX2}$ connected in series and the capacitors $C_{OX3}$, $C_{DEP3}$, $C_{DEP4}$ and $C_{OX4}$ connected in series are coupled in parallel, to provide the capacitance $C_{Tune}$. Thus, the varactor 600 can provide a larger capacitance $C_{Tune}$. Furthermore, the terminals A and B of the varactor 600 also can be disposed on any conductive layer of the wafer DIE1 or DIE2, so as to form the capacitors $C_{Block1}$ and $C_{Block2}$.

Figure 9:
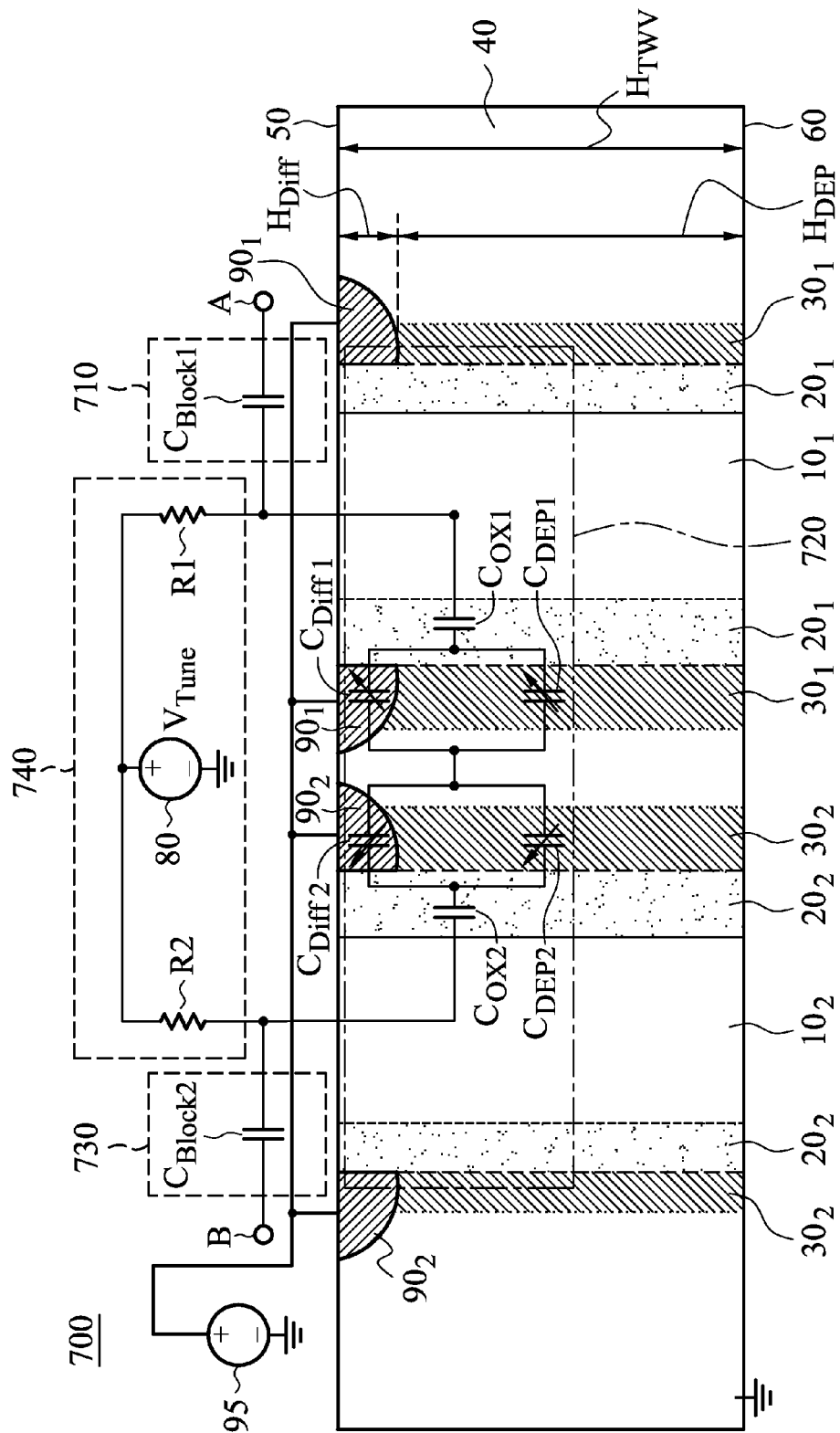
FIG. 9 shows an equivalent parasitic model of a varactor according to an embodiment of the disclosure.

FIG. 9 shows an equivalent parasitic model of a varactor 700 according to an embodiment of the disclosure. The varactor 700 comprises a DC blocking unit 710, a TWV unit 720, a DC blocking unit 730 and a DC bias unit 740. In FIG. 9, the semiconductor substrate 40 further comprises a diffusion region $90_1$ and a diffusion region $90_2$. The diffusion region $90_1$ is disposed in the semiconductor substrate 40, wherein the dielectric layer $20_1$ is surrounded by the diffusion region $90_1$. The diffusion region $90_2$ is disposed in the semiconductor substrate 40, wherein the dielectric layer $20_2$ is surrounded by the diffusion region $90_2$. In the embodiment, the diffusion region $90_1$ and the diffusion region $90_2$ are the doping N+ wells. As described above, when a voltage is respectively applied to the TWV $10_1$ and the TWV $10_2$, the capacitances of the parasitic capacitor $C_{DEP1}$ of the depletion region $30_1$ and the parasitic capacitor $C_{DEP2}$ of the depletion region $30_2$ are changed according to a variation of the applied voltage. Similarly, when the voltage is respectively applied to the TWV $10_1$ and the TWV $10_2$, various size depletion regions are formed for the diffusion region $90_1$ and the diffusion region $90_2$ depending on the majority carrier electrons and the minority carrier electron holes (e.g. the doping N+ wells). Therefore, the capacitances of the parasitic capacitor $C_{Diff1}$ of the diffusion region $90_1$ and the parasitic capacitor $C_{Diff2}$ of the diffusion region $90_2$ are changed according to a variation of a voltage applied by a bias voltage source 95. As shown in FIG. 9, the capacitor $C_{DEP1}$ is coupled to the capacitor $C_{Diff1}$ in parallel, and the capacitor $C_{DEP2}$ is coupled to the capacitor $C_{Diff2}$ in parallel, i.e. the capacitor $C_{Diff1}$ and the capacitor $C_{DEP1}$ are the sub-capacitors that form a first depletion-region capacitor and the capacitor $C_{Diff2}$ and the capacitor $C_{DEP2}$ are the sub-capacitors that form a second depletion-region capacitor. Therefore, the capacitance $C_{Tune}$ is determined by the capacitor $C_{OX2}$, the capacitors $C_{DEP2}$ and $C_{Diff2}$ connected in parallel, the capacitors $C_{DEP1}$ and $C_{Diff1}$ connected in parallel and the capacitor $C_{OX1}$. In FIG. 9, $H_{TWV}$ represents the heights of the TWV $10_1$ and the TWV $10_2$, $H_{DEP}$ represents the heights of the depletion region $30_1$ and the depletion region $30_2$, and $H_{Diff}$ represents the heights of the diffusion region $90_1$ and the diffusion region $90_2$. In the embodiment, the height of the depletion region is much larger than that of the diffusion region (i.e. $H_{DEP} \gg H_{Diff}$), so the effects and the capacitances of the capacitor $C_{Diff1}$ and the capacitor $C_{Diff2}$ are much smaller than that of the capacitor $C_{DEP1}$ and the capacitor $C_{DEP2}$. Thus, a variable capacitance $C_{Tune}$ of the varactor 700 is mainly determined by the capacitor $C_{DEP1}$ and the capacitor $C_{DEP2}$. Following the advancement of processes, when the height of the TWV is constantly decreased, the height of the depletion region may be similar to the height of the diffusion region (i.e. $H_{DEP} \approx H_{Diff}$) or the height of the depletion region may be much smaller than the height of the diffusion region (i.e. $H_{DEP} \ll H_{Diff}$). Thus, for the capacitance $C_{Tune}$ of the varactor 700, the effects of the capacitor $C_{Diff1}$ and the capacitor $C_{Diff2}$ are obvious. Furthermore, in an embodiment, when a varactor is formed by a plurality of stacked wafers, the respective process step will decide whether the TWV structure of each wafer needs the diffusion regions. For example, a varactor is formed by two stacked wafers, such as the varactor 600 of FIG. 8, wherein the TWV structure of each wafer further comprises the diffusion regions.

Figure 10:
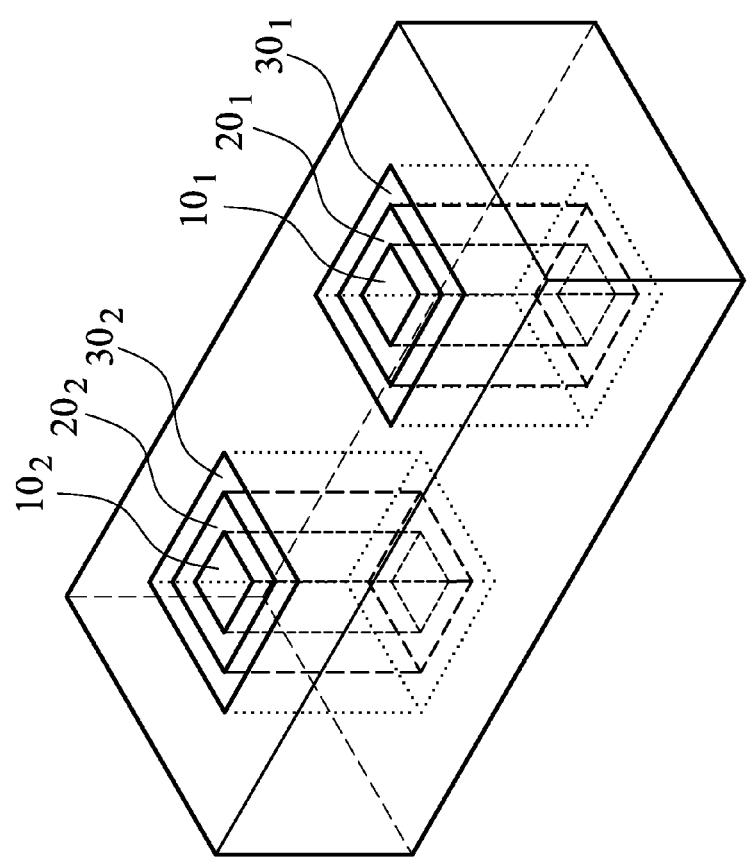
FIG. 10 shows a perspective diagram illustrating a dual through-wafer via structure according to another embodiment of the disclosure.

FIG. 10 shows a perspective diagram illustrating a dual TWV structure according to another embodiment of the disclosure. In the embodiment, the TWV $10_1$ and the TWV $10_2$ are cuboids. Compared to the cylinder TWV, a larger and closer coupling surface exists between the two cuboid TWVs, thereby obtaining a larger capacitance. It is to be noted that the shape of the TWV can be determined according to actual applications.

Furthermore, the dual TWV structure of the disclosure can also be used in an insulation substrate, such as a glass substrate (i.e. an interposer), an Aluminum Nitride substrate, and so on. Therefore, a depletion-region capacitor can be formed between two TWVs without the use of dielectric layers (e.g. the dielectric layer $20_1$ and $20_2$).

Figure 11:
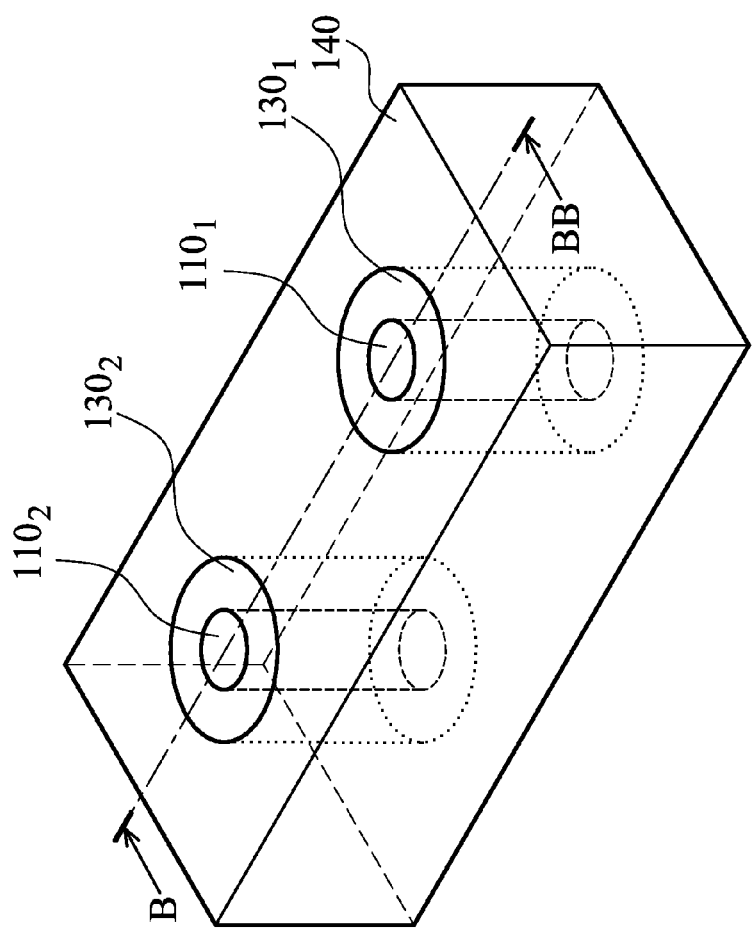
FIG. 11 shows a perspective diagram illustrating a dual through-wafer via structure according to another embodiment of the disclosure.

FIG. 11 shows a perspective diagram illustrating a dual TWV structure according to another embodiment of the disclosure. In FIG. 11, the TWV $110_1$ and the TWV $110_2$ are disposed in an insulation substrate 140. Furthermore, when a voltage is respectively applied to the TWV $110_1$ and TWV $110_2$, the circumferences of the TWV $110_1$ and TWV $110_2$ form a depletion region $130_1$ and a depletion region $130_2$, respectively. In the embodiment, a depletion-region capacitor is formed between the two TWVs without the dielectric layers (e.g. the dielectric layer $20_1$ and $20_2$). Furthermore, in the embodiment, the TWV $110_1$ and the TWV $110_2$ are cylinders. In an embodiment, the TWV $110_1$ and the TWV $110_2$ may be cuboids. As described above, compared to the cylinder TWV, a larger and closer coupling surface exists between the two cuboid TWVs, thereby obtaining a larger capacitance. It should be noted that the shape of the TWV can be determined according to actual applications.

Figure 12:
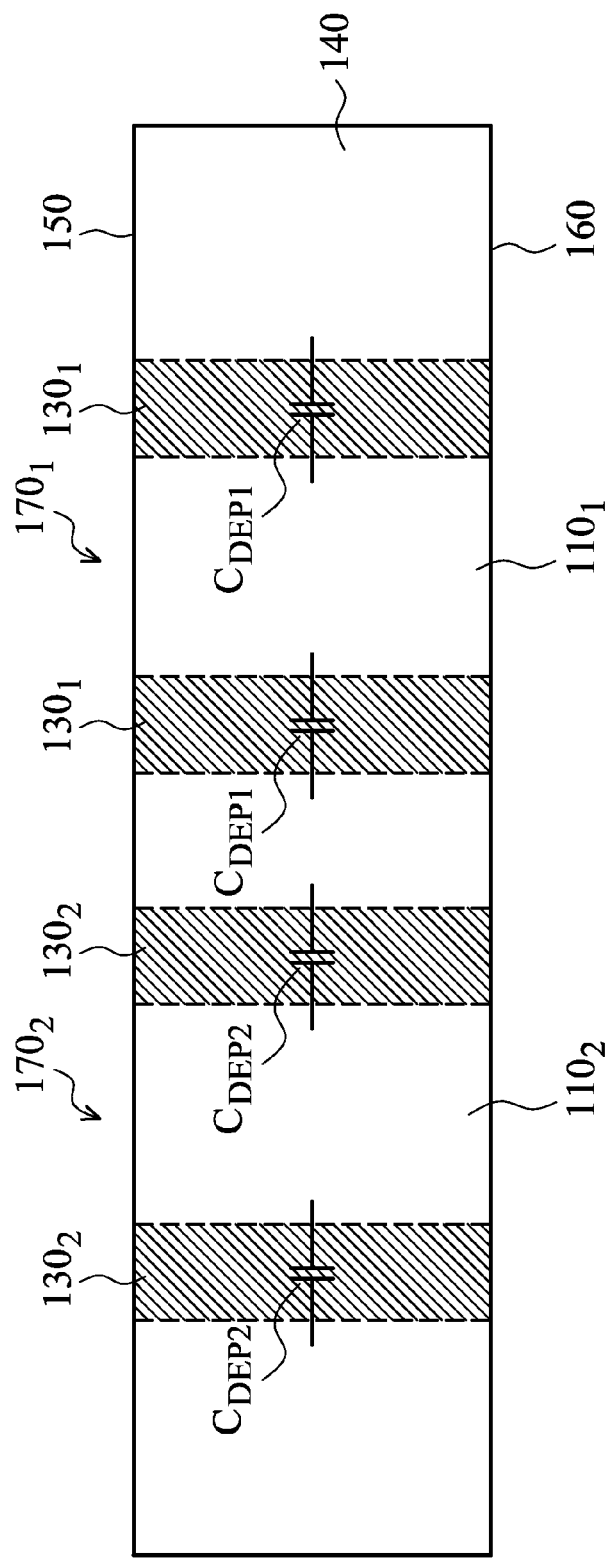
FIG. 12 shows a sectional diagram along a section line B-BB of the dual through-wafer via structure of FIG. 11.

FIG. 12 shows a sectional diagram along a section line B-BB of the dual TWV structure of FIG. 11. In FIG. 12, an insulation substrate 140 comprises a first surface 150 (e.g. an upper surface) and a second surface 160 (e.g. a lower surface), wherein the first surface 150 and the second surface 160 are substantially parallel to each other. Moreover, the insulation substrate 140 further comprises a first opening $170_1$ and a second opening $170_2$ throughout the insulation substrate 140, i.e. the first opening $170_1$ and the second opening $170_2$ are both extended to the second surface 160 from the first surface 150. When a voltage is respectively applied to the TWV $110_1$ and the TWV $110_2$, the capacitances of a parasitic capacitor $C_{DEP1}$ of the depletion region $130_1$ and a parasitic capacitor $C_{DEP2}$ of the depletion region $130_2$ are changed according to a variation in the applied voltage. Specifically, the capacitance of the parasitic capacitor $C_{DEP1}$ is determined according to the voltage difference between the insulation substrate 140 and the TWV $110_1$, and the capacitance of the parasitic capacitor $C_{DEP2}$ is determined according to the voltage difference between the insulation substrate 140 and the TWV $110_2$.

Figure 13:
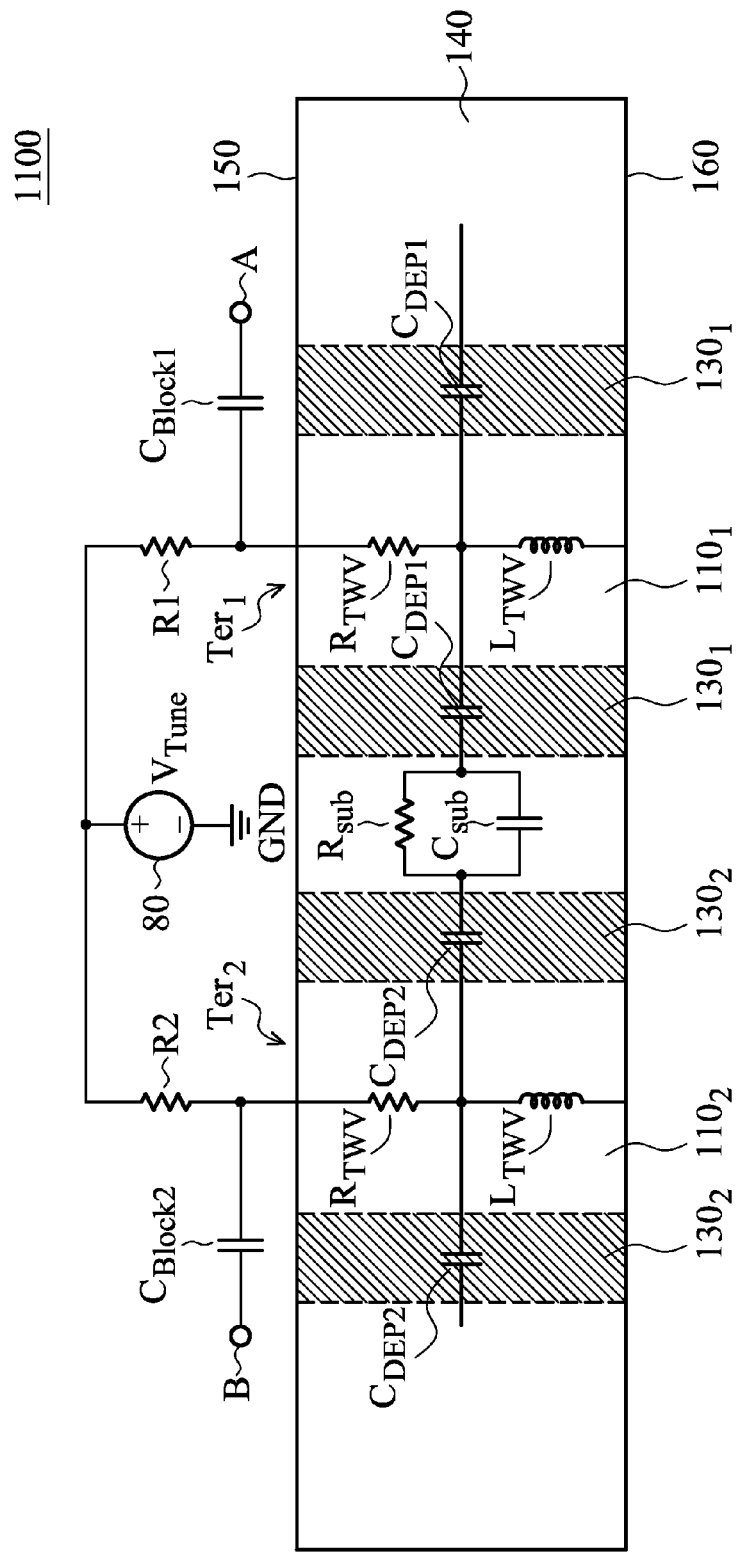
FIG. 13 shows an equivalent parasitic model of a varactor according to another embodiment of the disclosure.

FIG. 13 shows an equivalent parasitic model of a varactor 1100 according to another embodiment of the disclosure. In FIG. 13, a resistor $R_{TWV}$ represents a resistive loss of a TWV, and an inductor $L_{TWV}$ represents an inductive loss of the TWV. Furthermore, a resistor $R_{Sub}$ and a capacitor $C_{Sub}$ represent a substrate loss. Moreover, a bias voltage source 80 provides a bias voltage $V_{Tune}$ to the TWV $110_1$ and the TWV $110_2$ via the resistors R1 and R2, respectively, wherein the resistors R1 and R2 are used to pass a DC bias voltage and to block an AC signal. In an embodiment, the resistor R1 represents an equivalent parasitic resistor of a trace between a terminal $Ter_1$ aligned the first surface 150 and the bias voltage source 80, and the resistor R2 represents an equivalent parasitic resistor of a trace between a terminal $Ter_2$ aligned the first surface 150 and the bias voltage source 80. Furthermore, in another embodiment, other suitable devices (e.g. an inductor) can be used to replace the resistors R1 and R2, so as to pass the DC bias voltage and to block the AC signal. In addition, the bias voltage source 80 can be separated into two independent bias voltage sources, to provide different bias voltages to the terminal $Ter_1$ and the terminal $Ter_2$, respectively. In order to avoid the bias voltage $V_{Tune}$ being affected by the signals of terminals A and B applied to the TWV $110_1$ and the TWV $110_2$, respectively, the varactor 1100 further comprises a capacitor $C_{Block1}$ and a capacitor $C_{Block2}$, so as to adjust the DC level of the signal to the DC level of the bias voltage $V_{Tune}$. In the varactor 1100, the capacitor $C_{Block1}$ is coupled between the terminal $Ter_1$ of the TWV $110_1$ and the terminal A of the varactor 1100, and the capacitor $C_{Block2}$ is coupled between the terminal $Ter_2$ of the TWV $110_2$ and the terminal B of the varactor 1100.

Figure 14:
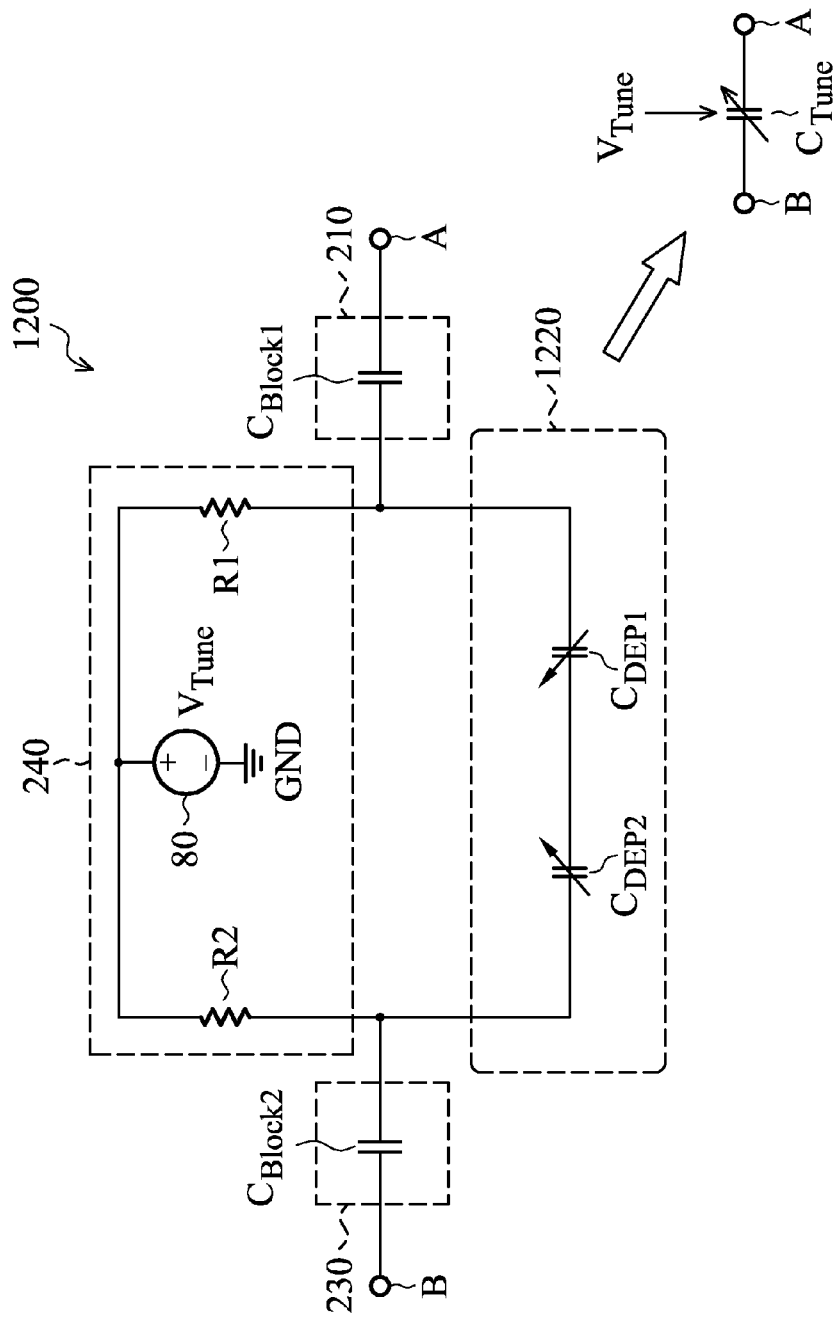
FIG. 14 shows an equivalent circuit diagram of a varactor according to another embodiment of the disclosure, wherein the varactor has a variable capacitance.

FIG. 14 shows an equivalent circuit diagram of a varactor 1200 according to another embodiment of the disclosure, wherein the varactor 1200 has a variable capacitance $C_{Tune}$. Referring to FIG. 13 and FIG. 14 together, compared with the capacitors $C_{DEP1}$ and $C_{DEP2}$, the resistors R1, R2, $R_{TWV}$ and $R_{Sub}$, the inductor $L_{TWV}$ and the capacitor $C_{Sub}$ have small parasitic effects, and no influence on the whole equivalent capacitance $C_{Tune}$. Thus, the small parasitic effects can be ignored in order to facilitate the estimation of the whole equivalent capacitance $C_{Tune}$. Therefore, only the coupling effects of the capacitors $C_{DEP1}$, $C_{DEP2}$, $C_{Block1}$ and $C_{Block2}$ need to be considered for the varactor 1200. Compared to the varactor 200 of FIG. 4, the TWV unit 1220 only comprises the capacitor $C_{DEP1}$ and the capacitor $C_{DEP2}$ connected in parallel. Therefore, the capacitance $C_{Tune}$ of the varactor 1200 is determined according to the capacitors $C_{DEP1}$, $C_{DEP2}$, $C_{Block1}$ and $C_{Block2}$, wherein the capacitances of the capacitor $C_{DEP1}$ and the capacitor $C_{DEP2}$ are controlled by the bias voltage $V_{Tune}$.

Figure 15:
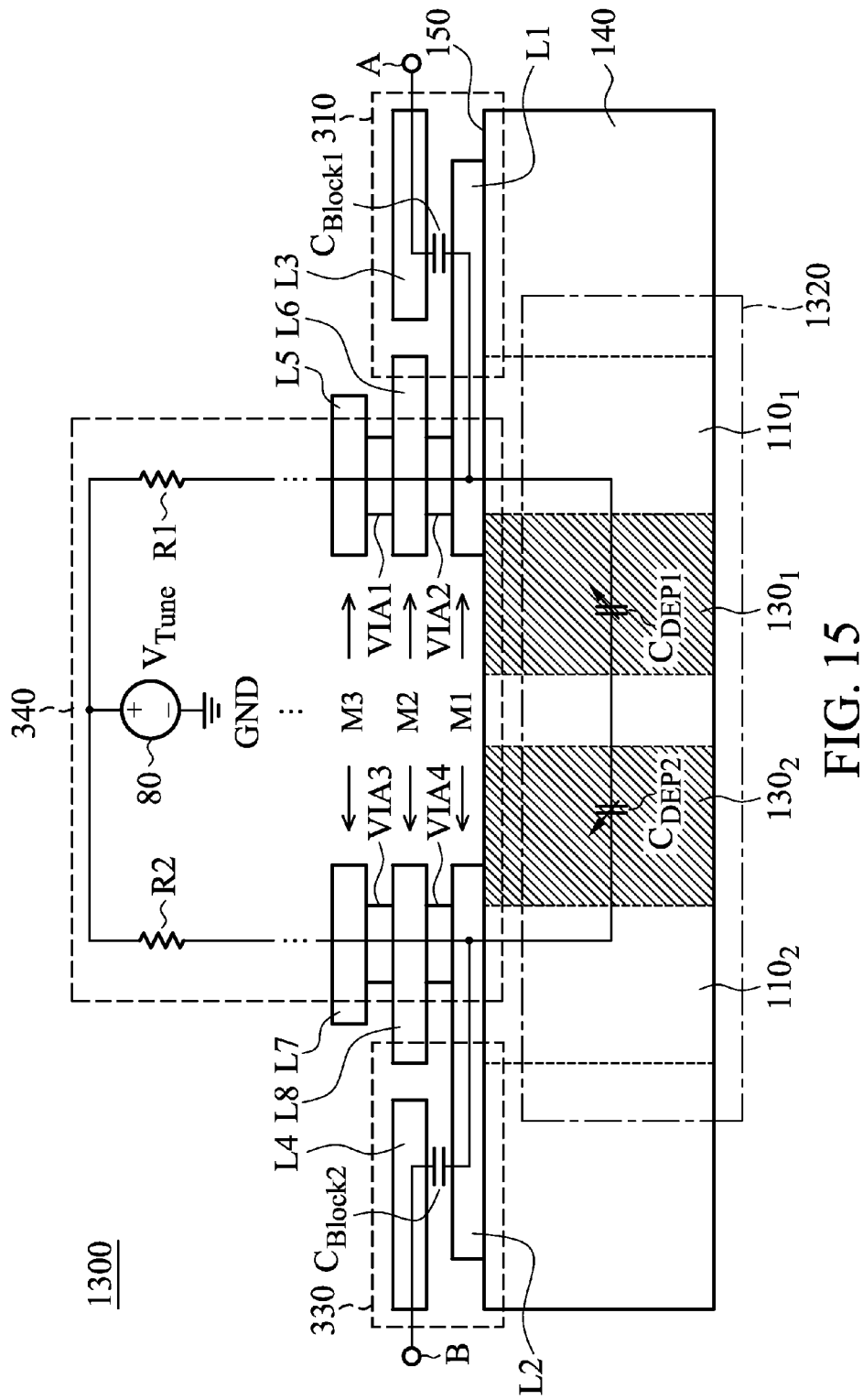
FIG. 15 shows a sectional diagram of a varactor according to another embodiment of the disclosure.

FIG. 15 shows a sectional diagram of a varactor 1300 according to another embodiment of the disclosure. In FIG. 15, a conductive layer M1 is disposed on the first surface 150 of the insulation substrate 140. A conductive layer M2 is disposed on the conductive layer M1. A conductive layer M3 is disposed on the conductive layer M2. In the embodiment, the conductive layers M1, M2 and M3 may be the metal layers or the poly-silicon layers. Furthermore, a dielectric layer is disposed between the two adjacent conductive layers, and the two adjacent conductive layers are connected to each other through the vias. Compared to the varactor 300 of FIG. 5, the TWV unit 1320 of the varactor 1300 is formed by the dual TWV structure disposed in the insulation substrate 140. Furthermore, the TWV unit 1320 only comprises the parasitic capacitor $C_{DEP1}$ of the depletion region $130_1$ and the parasitic capacitor $C_{DEP2}$ of the depletion region $130_2$. In FIG. 15, the capacitances of the parasitic capacitor $C_{DEP1}$ of the depletion region $130_1$ and the parasitic capacitor $C_{DEP2}$ of the depletion region $130_2$ are controlled by adjusting the bias voltage $V_{Tune}$. It should be noted that the two TWVs of FIG. 15 are used as an example to illustrate, and not to limit the disclosure. In other embodiments, more TWVs can be implemented in the insulation substrate 140, the connections (e.g. in series, parallel, or combinations thereof) of the parasitic capacitors of the depletion regions can be controlled by various traces of the conductive layers, so as to change the capacitance $C_{Tune}$ of the varactor.

Figure 16:
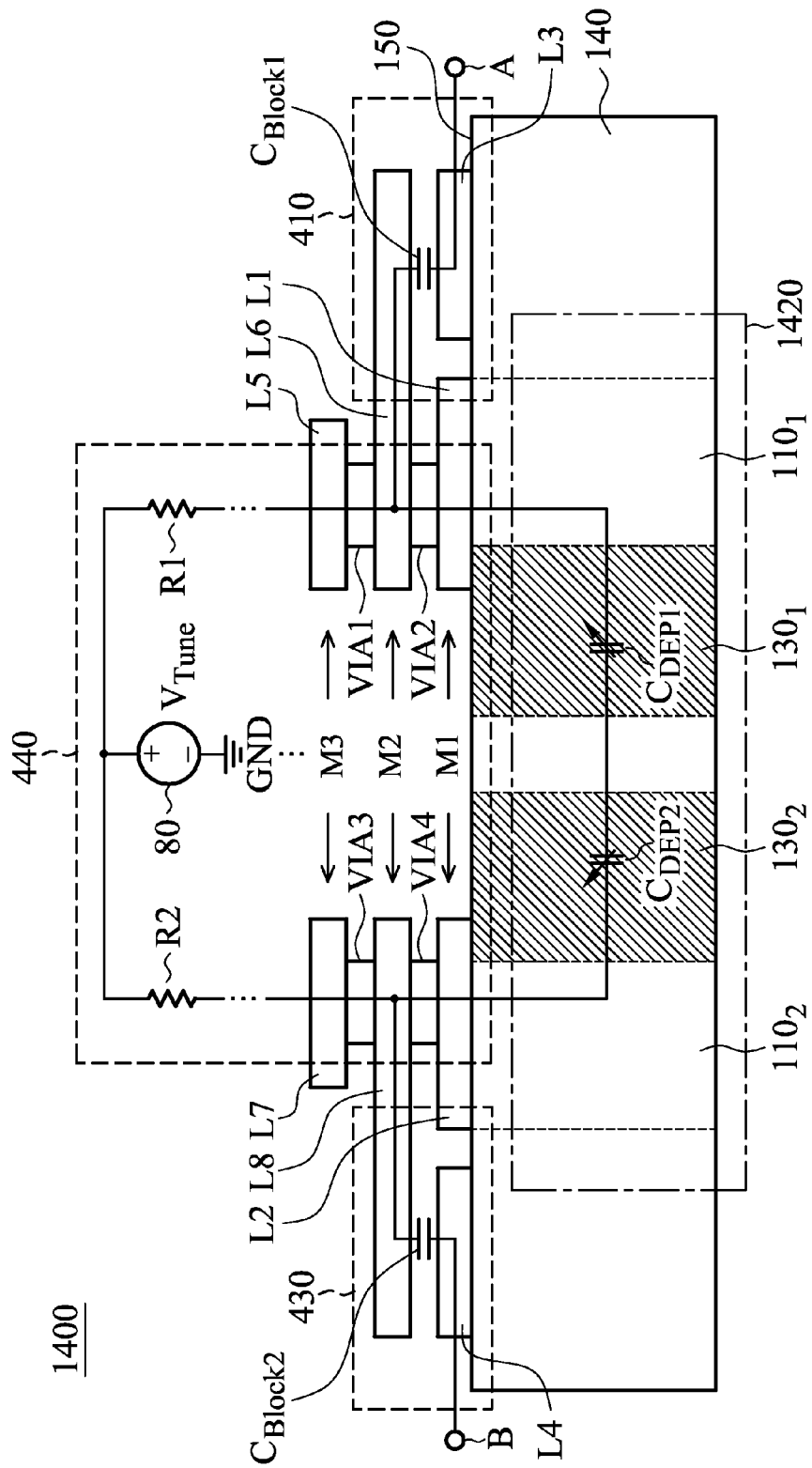
FIG. 16 shows a sectional diagram of a varactor according to another embodiment of the disclosure.

FIG. 16 shows a sectional diagram of a varactor 1400 according to another embodiment of the disclosure. The TWV unit 1420 of the varactor 1400 is formed by the dual TWV structure disposed in the insulation substrate 140. Furthermore, compared to the TWV unit 420 of FIG. 6, the TWV unit 1420 only comprises the depletion capacitor $C_{DEP1}$ and the depletion capacitor $C_{DEP2}$. In the embodiment, according to the actual layout status, the traces of any two conductive layers and the dielectric layer between the conductive layers can be used to form the capacitors $C_{Block1}$ and $C_{Block2}$.

Figure 17:
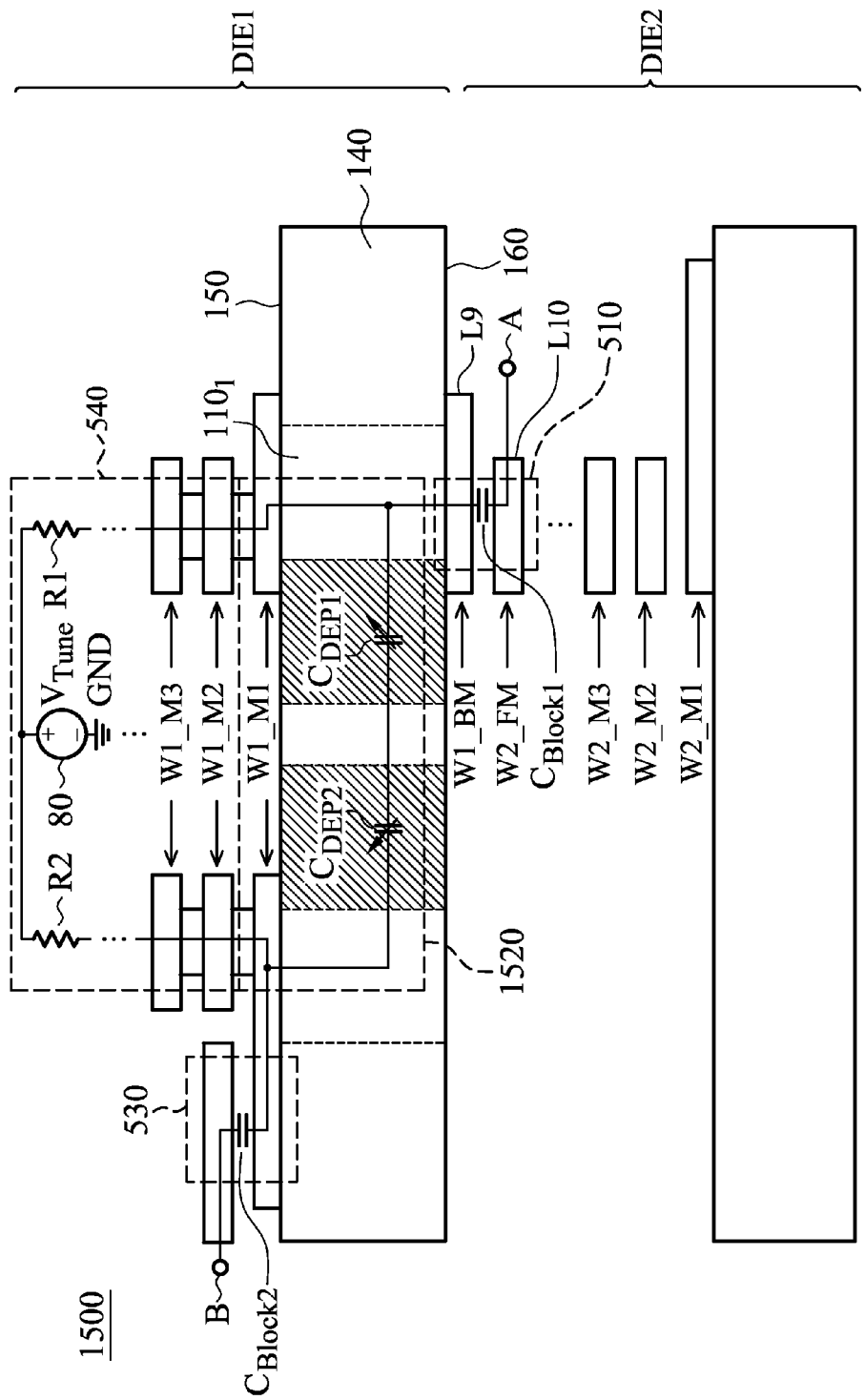
FIG. 17 shows a sectional diagram of a varactor according to another embodiment of the disclosure.

FIG. 17 shows a sectional diagram of a varactor 1500 according to another embodiment of the disclosure. In the embodiment, a wafer DIE1 and a wafer DIE2 are stacked to form the varactor 1500. Compared to the TWV unit 520 of FIG. 7, the TWV unit 1520 only comprises the depletion capacitor $C_{DEP1}$ and the depletion capacitor $C_{DEP2}$. In one embodiment, the conductive layer W1_BM is a bottom metal of the upper wafer DIE1, and the conductive layer W2_FM is a front metal of the lower wafer DIE2.

Figure 18:
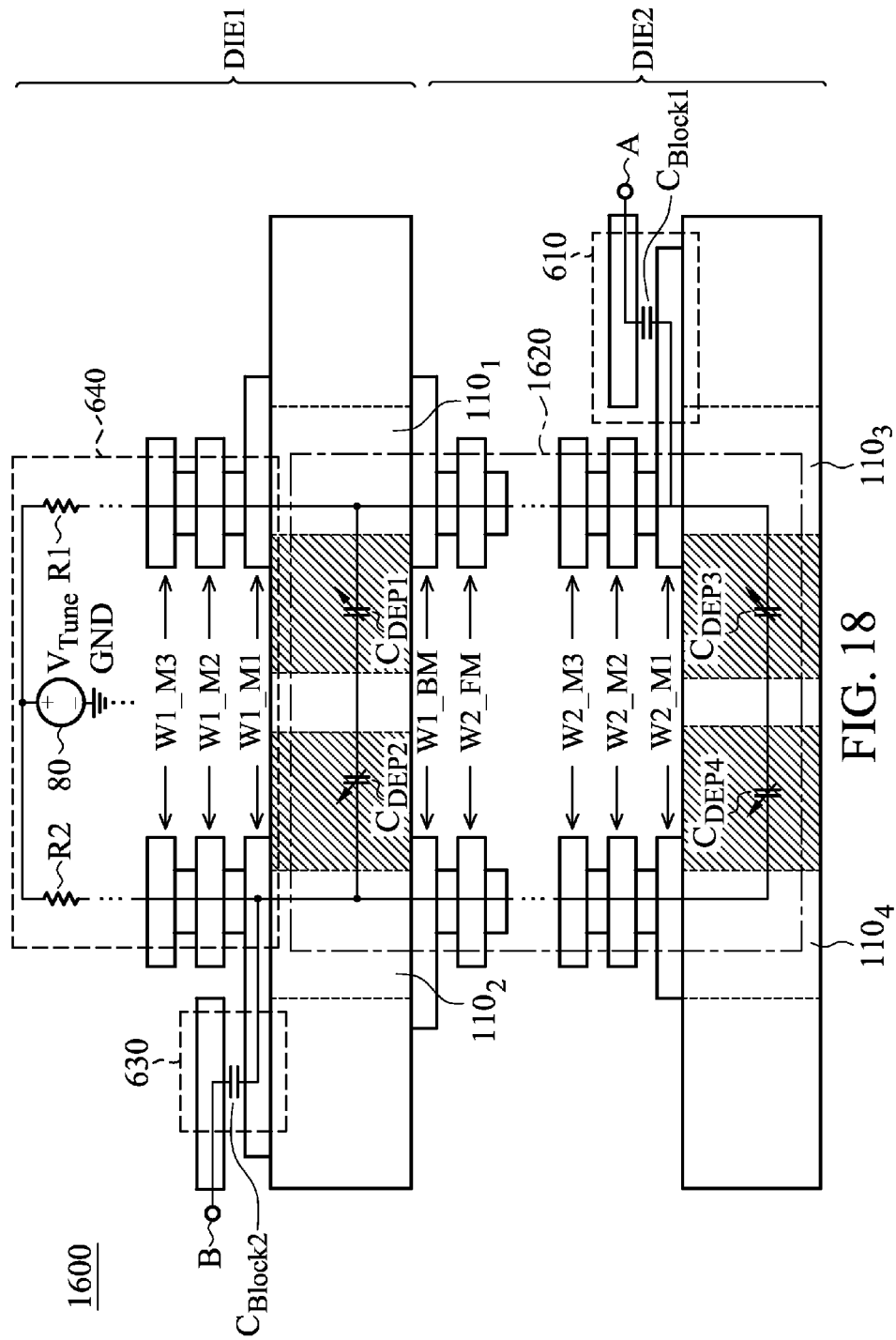
FIG. 18 shows a sectional diagram of a varactor according to another embodiment of the disclosure.

FIG. 18 shows a sectional diagram of a varactor 1600 according to another embodiment of the disclosure. In the embodiment, a wafer DIE1 and a wafer DIE2 are stacked to form the varactor 1600. The TWV unit 1620 of the varactor 1600 is formed by paralleling the TWV structures of the two wafers DIE1 and DIE2. The TWV $110_1$ of the wafer DIE1 is coupled to the TWV $110_3$ of the wafer DIE2 through the traces of the conductive layers W1_BM, W2_FM, . . . , W2_M3, W2_M2 and W2_M1 sequentially and the vias between the conductive layers, and the TWV $110_2$ of the wafer DIE1 is coupled to the TWV $110_4$ of the wafer DIE2 through the traces of the conductive layers W1_BM, W2_FM, . . . , W2_M3, W2_M2 and W2_M1 sequentially and the vias between the conductive layers. Therefore, the capacitors $C_{DEP1}$ and $C_{DEP2}$ connected in series and the capacitors $C_{DEP3}$ and $C_{DEP4}$ connected in series are coupled in parallel, to provide the capacitance $C_{Tune}$. Thus, the varactor 1600 can provide a larger capacitance $C_{Tune}$.

Figure 19:
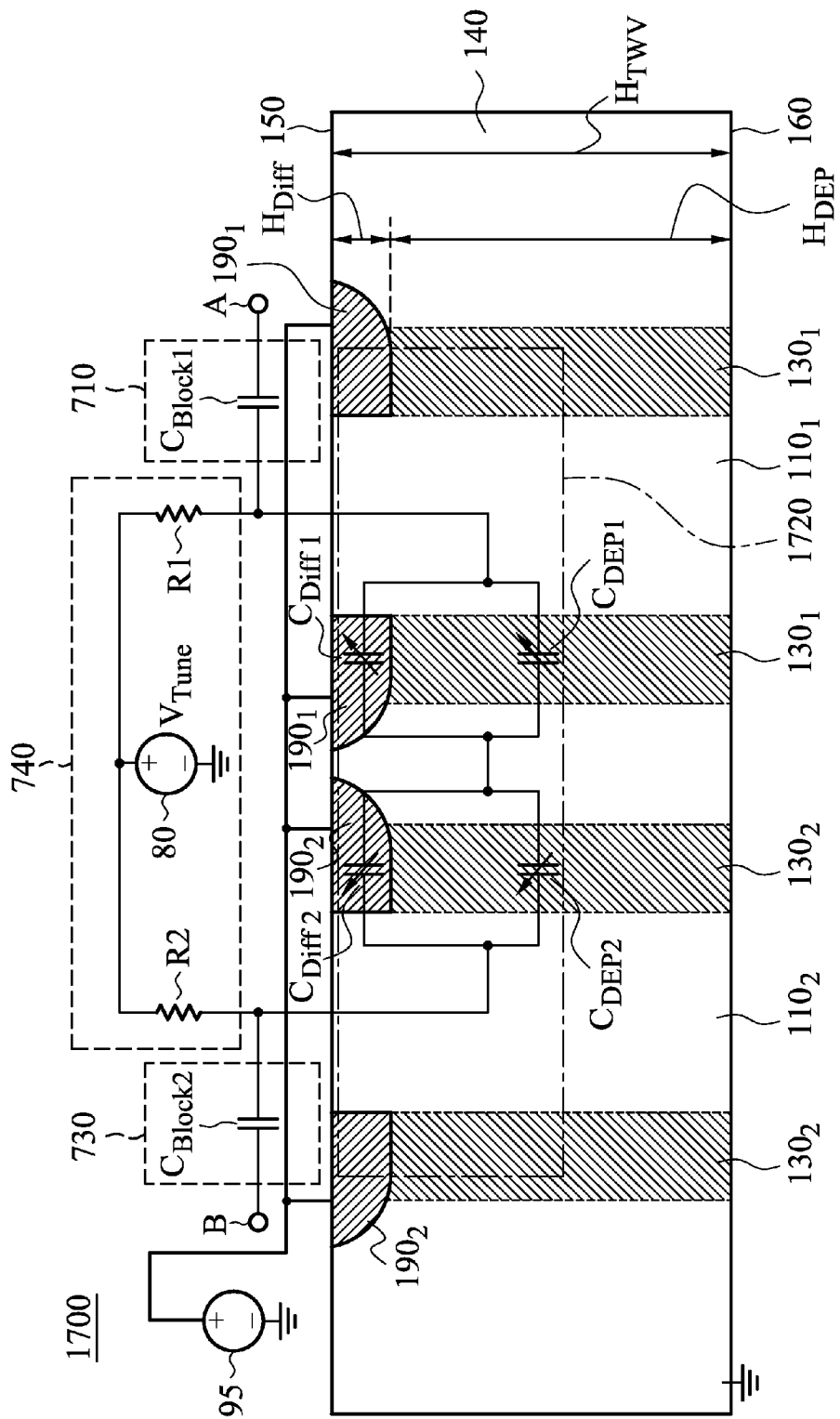
FIG. 19 shows an equivalent parasitic model of a varactor according to an embodiment of the disclosure.

FIG. 19 shows an equivalent parasitic model of a varactor 1700 according to an embodiment of the disclosure. In FIG. 19, the insulation substrate 140 further comprises a diffusion region $190_1$ and a diffusion region $190_2$. The diffusion region $190_1$ is disposed in the insulation substrate 140, wherein the TWV $110_1$ is surrounded by the diffusion region $190_1$. The diffusion region $190_2$ is disposed in the insulation substrate 140, wherein the TWV $110_2$ is surrounded by the diffusion region $190_2$. In the embodiment, the diffusion region $190_1$ and the diffusion region $190_2$ are the doping N+ wells. As described above, when a voltage is respectively applied to the TWV $110_1$ and the TWV $110_2$, the capacitances of the parasitic capacitor $C_{DEP1}$ of the depletion region $130_1$ and the parasitic capacitor $C_{DEP2}$ of the depletion region $130_2$ are changed according to a variation of the applied voltage. Similarly, when the voltage is respectively applied to the TWV $110_1$ and the TWV $110_2$, various size depletion regions are formed for the diffusion region $190_1$ and the diffusion region $190_2$ depending on the majority carrier electrons and the minority carrier electron holes (e.g. the doping N+ wells). Therefore, the capacitances of the parasitic capacitor $C_{Diff1}$ of the diffusion region $190_1$ and the parasitic capacitor $C_{Diff2}$ of the diffusion region $190_2$ are changed according to a variation of a voltage applied by a bias voltage source 95. As shown in FIG. 19, the capacitor $C_{DEP1}$ is coupled to the capacitor $C_{Diff1}$ in parallel, and the capacitor $C_{DEP2}$ is coupled to the capacitor $C_{Diff2}$ in parallel. Therefore, the capacitance $C_{Tune}$ is determined by the capacitor $C_{OX2}$, the capacitors $C_{DEP2}$ and $C_{Diff2}$ connected in parallel, the capacitors $C_{DEP1}$ and $C_{Diff1}$ connected in parallel and the capacitor $C_{OX1}$. In FIG. 19, $H_{TWV}$ represents the heights of the TWV $110_1$ and the TWV $110_2$, $H_{DEP}$ represents the heights of the depletion region $130_1$ and the depletion region $130_2$, and $H_{Diff}$ represents the heights of the diffusion region $190_1$ and the diffusion region $190_2$. In the embodiment, the height of the depletion region is much larger than that of the diffusion region (i.e. $H_{DEP} \gg H_{Diff}$), so the effects and the capacitances of the capacitor $C_{Diff1}$ and the capacitor $C_{Diff2}$ are much smaller than that of the capacitor $C_{DEP1}$ and the capacitor $C_{DEP2}$. Thus, a variable capacitance $C_{Tune}$ of the varactor 1700 is mainly determined by the capacitor $C_{DEP1}$ and the capacitor $C_{DEP2}$. Following the advancement of processes, when the height of the TWV is constantly decreased, the height of the depletion region may be similar to the height of the diffusion region (i.e. $H_{DEP} \approx H_{Diff}$) or the height of the depletion region may be much smaller than the height of the diffusion region (i.e. $H_{DEP} \ll H_{Diff}$). Thus, for the capacitance $C_{Tune}$ of the varactor 1700, the effects of the capacitor $C_{Diff1}$ and the capacitor $C_{Diff2}$ are obvious. Furthermore, in an embodiment, when a varactor is formed by a plurality of stacked wafers, the respective process step will decide whether the TWV structure of each wafer needs the diffusion regions. For example, a varactor is formed by two stacked wafers, such as the varactor 1600 of FIG. 18, wherein the TWV structure of each wafer further comprises the diffusion regions.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A varactor, comprising:
    a substrate, comprising a first surface, a second surface substantially parallel to the first surface, and a first opening and a second opening in the substrate;
    a conductive material, filling the first opening and the second opening to form a first through-wafer via and a second through-wafer via, respectively;
    a first capacitor coupled between the first through-wafer via and a first terminal; and
    a second capacitor coupled between the second through-wafer via and a second terminal,
    wherein a capacitance of a first depletion-region capacitor between the first through-wafer via and the second through-wafer via is determined by a bias voltage applied to the first through-wafer via and the second through-wafer via.

2. The varactor as claimed in claim 1, further comprising:
    a first dielectric layer, surrounding an inner surface of the first opening of the substrate; and
    a second dielectric layer, surrounding an inner surface of the second opening of the substrate,
    wherein the substrate is a semiconductor substrate.

3. The varactor as claimed in claim 2, further comprising:
    a first conductive layer disposed on the first surface of the substrate, comprises a first trace and a second trace; and
    a second conductive layer disposed on the first conductive layer, comprises a third trace and a fourth trace; and
    a third dielectric layer disposed between the first conductive layer and the second conductive layer.

4. The varactor as claimed in claim 3, wherein the first trace and the second trace are coupled to the first through-wafer via and the second through-wafer via, respectively, and the first capacitor is a first coupling capacitor between the first trace and the third trace, and the second capacitor is a second coupling capacitor between the second trace and the fourth trace.

5. The varactor as claimed in claim 3, wherein the third trace and the fourth trace are coupled to the first through-wafer via and the second through-wafer via, respectively, and the first capacitor is a first coupling capacitor between the first trace and the third trace, and the second capacitor is a second coupling capacitor between the second trace and the fourth trace.

6. The varactor as claimed in claim 3, further comprising:
    a third conductive layer disposed on the second surface of the substrate, comprising a fifth trace;
    a fourth conductive layer disposed on the third conductive layer, comprising a sixth trace; and
    a fourth dielectric layer disposed between the third conductive layer and the fourth conductive layer.

7. The varactor as claimed in claim 6, wherein the first trace and the fifth trace are coupled to the first through-wafer via and the second through-wafer via, respectively, and the first capacitor is a first coupling capacitor between the first trace and the third trace, and the second capacitor is a second coupling capacitor between the fifth trace and the sixth trace.

8. The varactor as claimed in claim 2, further comprising:
    a first diffusion region disposed in the substrate and surrounding the first dielectric layer corresponding to the first through-wafer via; and
    a second diffusion region disposed in the substrate and surrounding the second dielectric layer corresponding to the second through-wafer via,
    wherein when the bias voltage is applied to the first through-wafer via and the second through-wafer via, the first diffusion region between the first through-wafer via and the second through-wafer via forms a second depletion-region capacitor, and the second diffusion region between the first through-wafer via and the second through-wafer via forms a third depletion-region capacitor, wherein the first and second diffusion regions are coupled to a bias voltage source.

9. The varactor as claimed in claim 8, wherein the first depletion-region capacitor further comprises a first sub-capacitor corresponding to the first through-wafer via and a second sub-capacitor corresponding to the second through-wafer via, wherein the first sub-capacitor is coupled to the second depletion-region capacitor in parallel and the second sub-capacitor is coupled to the third depletion-region capacitor in parallel.

10. The varactor as claimed in claim 2, wherein the substrate is coupled to a bias voltage source.

11. The varactor as claimed in claim 1, wherein the substrate is an insulation substrate.

12. The varactor as claimed in claim 11, further comprising:
    a first conductive layer disposed on the first surface of the substrate, comprising a first trace and a second trace;
    a second conductive layer disposed on the first conductive layer, comprising a third trace and a fourth trace; and
    a first dielectric layer disposed between the first conductive layer and the second conductive layer.

13. The varactor as claimed in claim 12, wherein the first trace and the second trace are coupled to the first through-wafer via and the second through-wafer via, respectively, and the first capacitor is a first coupling capacitor between the first trace and the third trace, and the second capacitor is a second coupling capacitor between the second trace and the fourth trace.

14. The varactor as claimed in claim 12, wherein the third trace and the fourth trace are coupled to the first through-wafer via and the second through-wafer via, respectively, and the first capacitor is a first coupling capacitor between the first trace and the third trace, and the second capacitor is a second coupling capacitor between the second trace and the fourth trace.

15. The varactor as claimed in claim 12, further comprising:
    a third conductive layer disposed on the second surface of the substrate, comprising a fifth trace;
    a fourth conductive layer disposed on the third conductive layer, comprising a sixth trace; and
    a second dielectric layer disposed between the third conductive layer and the fourth conductive layer.

16. The varactor as claimed in claim 15, wherein the first trace and the fifth trace are coupled to the first through-wafer via and the second through-wafer via, respectively, and the first capacitor is a first coupling capacitor between the first trace and the third trace, and the second capacitor is a second coupling capacitor between the fifth trace and the sixth trace.

17. The varactor as claimed in claim 11, further comprising:
- a first diffusion region disposed in the substrate and surrounding the first through-wafer via; and
- a second diffusion region disposed in the substrate and surrounding the second through-wafer via,
- wherein when the bias voltage is applied to the first through-wafer via and the second through-wafer via, the first diffusion region between the first through-wafer via and the second through-wafer via forms a second depletion-region capacitor, and the second diffusion region between the first through-wafer via and the second through-wafer via forms a third depletion-region capacitor, wherein the first and second diffusion regions are coupled to a bias voltage source.

18. The varactor as claimed in claim 17, wherein the first depletion-region capacitor further comprises a first sub-capacitor corresponding to the first through-wafer via and a second sub-capacitor corresponding to the second through-wafer via, wherein the first sub-capacitor is coupled to the second depletion-region capacitor in parallel and the second sub-capacitor is coupled to the third depletion-region capacitor in parallel.

19. The varactor as claimed in claim 1, wherein the first capacitor and the second capacitor are used to block the direct current components of an input signal and an output signal of the varactor.

20. A varactor, comprising:
a first wafer, comprising:
- a first substrate, comprising a first surface, a second surface substantially parallel to the first surface, and a first opening and a second opening in the first substrate;
- a first conductive material, filling the first opening and the second opening to form a first through-wafer via and a second through-wafer via, respectively;
- a first conductive layer disposed on the second surface of the first substrate, comprising a first trace coupled to the second through-wafer via; and
- a first capacitor coupled between the first through-wafer via and a first terminal; and
a second wafer disposed below the first wafer, comprising:
- a second substrate, comprising a third surface and a fourth surface substantially parallel to the first surface; and
- a second conductive layer disposed on the third surface of the second substrate, comprising a second trace coupled to a second terminal,
- wherein a second capacitor is formed by the first trace of the first conductive layer and the second trace of the second conductive layer,
- wherein a capacitance of a first depletion-region capacitor between the first through-wafer via and the second through-wafer via is determined by a bias voltage applied to the first through-wafer via and the second through-wafer via.

21. The varactor as claimed in claim 20, wherein the first wafer further comprises:
- a first dielectric layer, surrounding an inner surface of the first opening of the first substrate; and
- a second dielectric layer, surrounding an inner surface of the second opening of the first substrate,
- wherein the first substrate and the second substrate are semiconductor substrates.

22. The varactor as claimed in claim 21, wherein the first wafer further comprises:
- a third conductive layer disposed on the first surface of the first substrate, comprising a third trace; and
- a fourth conductive layer disposed on the third conductive layer, comprising a fourth trace; and
- a third dielectric layer disposed between the third conductive layer and the fourth conductive layer.

23. The varactor as claimed in claim 22, wherein the second substrate further comprises a third opening and a fourth opening in the second substrate, and the second wafer further comprises:
- a fourth dielectric layer, surrounding an inner surface of the third opening of the second substrate;
- a fifth dielectric layer, surrounding an inner surface of the fourth opening of the second substrate; and
- a second conductive material, wherein the second conductive material is formed inside the fourth and fifth dielectric layers and filling the third opening and the fourth opening to form a third through-wafer via and a fourth through-wafer via, respectively,
- wherein a capacitance of a second depletion-region capacitor between the fourth dielectric layer corresponding to the third through-wafer via and the fifth dielectric layer corresponding to the fourth through-wafer via is determined by the bias voltage applied to the third through-wafer via and the fourth through-wafer via.

24. The varactor as claimed in claim 22, wherein the third trace is coupled to the first through-wafer via, and the first capacitor is a coupling capacitor between the third trace and the fourth trace.

25. The varactor as claimed in claim 22, wherein the fourth trace is coupled to the first through-wafer via, and the first capacitor is a coupling capacitor between the third trace and the fourth trace.

26. The varactor as claimed in claim 21, wherein the first wafer further comprises:
- a first diffusion region disposed in the first substrate and surrounding the first dielectric layer corresponding to the first through-wafer via; and
- a second diffusion region disposed in the first substrate and surrounding the second dielectric layer corresponding to the second through-wafer via,
- wherein when the bias voltage is applied to the first through-wafer via and the second through-wafer via, the first diffusion region between the first through-wafer via and the second through-wafer via forms a third depletion-region capacitor, and the second diffusion region between the first through-wafer via and the second through-wafer via forms a fourth depletion-region capacitor, wherein the first and second diffusion regions are coupled to a bias voltage source.

27. The varactor as claimed in claim 26, wherein the first depletion-region capacitor further comprises a first sub-capacitor corresponding to the first through-wafer via and a second sub-capacitor corresponding to the second through-wafer via, wherein the first sub-capacitor is coupled to the third depletion-region capacitor in parallel and the second sub-capacitor is coupled to the fourth depletion-region capacitor in parallel.

28. The varactor as claimed in claim 21, wherein the first substrate of the first wafer and the second substrate of the second wafer are coupled to a bias voltage source.

29. The varactor as claimed in claim 20, wherein the first capacitor and the second capacitor are used to block the direct current components of an input signal and an output signal of the varactor.

30. The varactor as claimed in claim 20, wherein the first and second substrates are insulation substrates.

31. The varactor as claimed in claim 30, wherein the first wafer further comprises:
   a third conductive layer disposed on the first surface of the first substrate, comprises a third trace;
   a fourth conductive layer disposed on the third conductive layer, comprises a fourth trace; and
   a first dielectric layer disposed between the third conductive layer and the fourth conductive layer.

32. The varactor as claimed in claim 31, wherein the second substrate further comprises a third opening and a fourth opening in the second substrate, and the second wafer further comprises:
   a second conductive material, filling the third opening and the fourth opening to form a third through-wafer via and a fourth through-wafer via, respectively,
   wherein a capacitance of a second depletion-region capacitor between the third through-wafer via and the fourth through-wafer via is determined by the bias voltage applied to the third through-wafer via and the fourth through-wafer via.

33. The varactor as claimed in claim 31, wherein the third trace is coupled to the first through-wafer via, and the first capacitor is a coupling capacitor between the third trace and the fourth trace.

34. The varactor as claimed in claim 31, wherein the fourth trace is coupled to the first through-wafer via, and the first capacitor is a coupling capacitor between the third trace and the fourth trace.

35. The varactor as claimed in claim 30, wherein the first wafer further comprises:
   a first diffusion region disposed in the first substrate and surrounding the first through-wafer via; and
   a second diffusion region disposed in the first substrate and surrounding the second through-wafer via,
   wherein when the bias voltage is applied to the first through-wafer via and the second through-wafer via, the first diffusion region between the first through-wafer via and the second through-wafer via forms a third depletion-region capacitor, and the second diffusion region between the first through-wafer via and the second through-wafer via forms a fourth depletion-region capacitor, wherein the first and second diffusion regions are coupled to a bias voltage source.

36. The varactor as claimed in claim 35, wherein the first depletion-region capacitor further comprises a first sub-capacitor corresponding to the first through-wafer via and a second sub-capacitor corresponding to the second through-wafer via, wherein the first sub-capacitor is coupled to the third depletion-region capacitor in parallel and the second sub-capacitor is coupled to the fourth depletion-region capacitor in parallel.

37. The varactor as claimed in claim 30, wherein the first substrate of the first wafer and the second substrate of the second wafer are coupled to a bias voltage source.

* * * * *